US012581737B2

(12) United States Patent
Takechi

(10) Patent No.: US 12,581,737 B2
(45) Date of Patent: Mar. 17, 2026

(54) OXIDE SEMICONDUCTOR THIN-FILM TRANSISTOR DEVICE AND METHOD OF MANUFACTURING THE SAME

(71) Applicant: XIAMEN TIANMA DISPLAY TECHNOLOGY CO., LTD., Xiamen (CN)

(72) Inventor: Kazushige Takechi, Kawasaki (JP)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 393 days.

(21) Appl. No.: 18/127,944

(22) Filed: Mar. 29, 2023

(65) Prior Publication Data

US 2023/0317732 A1      Oct. 5, 2023

(30) Foreign Application Priority Data

Mar. 30, 2022    (JP) ................................. 2022-056684

(51) Int. Cl.
| | |
|---|---|
| *H01L 27/12* | (2006.01) |
| *H10D 86/01* | (2025.01) |

(Continued)

(52) U.S. Cl.
CPC ......... *H10D 86/60* (2025.01); *H10D 86/0221* (2025.01); *H10D 86/423* (2025.01); *H10D 86/471* (2025.01); *H10K 59/1213* (2023.02)

(58) Field of Classification Search
CPC .... H10D 86/60; H10D 86/0221; H10D 86/01; H10D 86/423; H10D 86/40;

(Continued)

(56) References Cited

U.S. PATENT DOCUMENTS

| | | | |
|---|---|---|---|
| 8,580,380 | B2 | 11/2013 | Kitagawa et al. |
| 10,115,742 | B2 | 10/2018 | Yamazaki et al. |

(Continued)

FOREIGN PATENT DOCUMENTS

| | | |
|---|---|---|
| JP | 2009263155 A | 11/2009 |
| JP | 2013211543 A | 10/2013 |

(Continued)

OTHER PUBLICATIONS

Office Action, issued in Japanese Patent Application No. 2022-056684 dated Sep. 16, 2025.

*Primary Examiner* — Nikolay K Yushin

(74) *Attorney, Agent, or Firm* — NIXON & VANDERHYE

(57) ABSTRACT

An oxide semiconductor TFT device includes a substrate and a first oxide semiconductor TFT on the substrate. The first oxide semiconductor TFT includes a first oxide semiconductor layer, a first top-gate electrode, and a first source/drain electrode. The first oxide semiconductor layer includes a first channel region overlapping the first top-gate electrode, and two first low-resistive regions sandwiching the first channel region. The first source/drain electrode is located upper than the first top-gate electrode and extends through an insulating region overlapping one of the two first low-resistive regions to be in contact with the one of the two first low-resistive regions. Each of the two first low-resistive regions and the first channel region includes a lower amorphous layer and an upper crystalline layer having a composition identical to a composition of the amorphous layer.

11 Claims, 18 Drawing Sheets

(51) Int. Cl.
    *H10D 86/40*       (2025.01)
    *H10D 86/60*       (2025.01)
    *H10K 59/121*     (2023.01)

(58) Field of Classification Search
    CPC ............. H10D 86/471; H10D 86/0223; H10D
                86/421; H10D 86/441; H10D 30/6755;
                H10D 30/67; H10D 30/6734; H10D
             30/6713; H10K 59/1213; H10K 59/121;
              H10K 59/38; H10K 59/124; H10K
                                59/122
    See application file for complete search history.

(56)                 References Cited

U.S. PATENT DOCUMENTS

| | | | |
|---|---|---|---|
| 10,872,982 B2 | 12/2020 | Ohno et al. | |
| 2010/0233451 A1 | 9/2010 | Kitagawa et al. | |
| 2013/0221345 A1* | 8/2013 | Ohno ................... | H01L 21/425 |
| | | | 257/43 |
| 2016/0163880 A1 | 6/2016 | Ohno et al. | |
| 2017/0236844 A1 | 8/2017 | Yamazaki et al. | |
| 2018/0175077 A1 | 6/2018 | Koo et al. | |
| 2021/0202540 A1 | 7/2021 | Kuwahara et al. | |
| 2021/0288079 A1 | 9/2021 | Yamazaki et al. | |
| 2021/0343878 A1* | 11/2021 | Ohta .................. | H01L 21/0262 |

FOREIGN PATENT DOCUMENTS

| | | | |
|---|---|---|---|
| JP | 2022020682 A | 2/2022 | |
| WO | 2008023719 A1 | 2/2008 | |
| WO | 2020075268 A1 | 4/2020 | |

\* cited by examiner

DATA LINE
Vdata

POWER LINE
Vdd

18

15

T3

17

EMISSION CONTROL LINE

SCANNING LINE

16

T2

T1

C1

E1

Vss
(CATHODE)

REFERENCE
VOLTAGE
SUPPLY LINE    Vref

DATA LINE
Vdata

POWER LINE
Vdd

SCANNING LINE 18     16

11

15

T2

T1

C1

E1

T4

Vss
(CATHODE)

19

RESET CONTROL LINE

TOP-GATE ELECTRODE
123

OXIDE SEMICONDUCTOR LAYER
102

INTERLAYER INSULATING LAYER
118

117

135

101

133

S/D ELECTRODE
122

TOP-GATE ELECTRODE
123

S/D ELECTRODE
121

S/D REGION
105

INTERLAYER INSULATING LAYER
118

UPPER INSULATING LAYER

117

S/D REGION
107

135

101

103
CHANNEL REGION

102
OXIDE SEMICONDUCTOR LAYER

TOP-GATE ELECTRODE
123

CRYSTALLINE LAYER                    OXYDE SEMICONDUCTOR LAYER
152                                              102

141

135

101

151

AMORPHOUS LAYER

133

BOTTOM-GATE ELECTRODE

UPPER INSULATING          TOP-GATE ELECTRODE
LAYER          127          123

He PLASMA                              He PLASMA          OXYDE SEMICONDUCTOR
                                                          LAYER 102

135

101

CRYSTALLINE
LAYER
116                                                        CRYSTALLINE
107                                                        LAYER
S/D REGION    115            111  112       133      114
              AMORPHOUS                                   113
              LAYER    AMORPHOUS   CRYSTALLINE            AMORPHOUS
                       LAYER       LAYER                 LAYER

105
                                                         S/D REGION

103    CHANNEL REGION

TOP-GATE ELECTRODE
123

OXIDE SEMICONDUCTOR LAYER
102

INTERLAYER INSULATING LAYER
128

UPPER INSULATING LAYER          127

135

101

133

S/D ELECTRODE
122

TOP-GATE ELECTRODE
123

S/D ELECTRODE
121

S/D REGION
105

INTERLAYER INSULATING LAYER
128

127

S/D REGION
107

135

101

103
CHANNEL REGION

102

OXIDE SEMICONDUCTOR LAYER

AZIMUTHAL DISTRIBUTION OF DIFFRACTION SPOTS
ON PLANE (111) (UPPER CRYSTALLINE LAYER)

AZIMUTHAL DISTRIBUTION OF DIFFRACTION SPOTS
ON PLANE (111) (LOWER AMORPHOUS LAYER)

UPPER LAYER (CRYSTALLINE LAYER)

FOURIER-TRANSFORMED
IMAGE
(EQUIVALENT TO
DIFFRACTED
ELECTRON BEAM)

TEM IMAGE

LOWER LAYER (AMORPHOUS LAYER)

FOURIER-TRANSFORMED
IMAGE
(EQUIVALENT TO
DIFFRACTED
ELECTRON BEAM)

TEM IMAGE

AZIMUTHAL DISTRIBUTION OF DIFFRACTION SPOTS ON PLANE (111) (CHANNEL REGION)

AZIMUTHAL DISTRIBUTION OF DIFFRACTION SPOTS ON PLANE (111) (S/D REGION)

OXIDE SEMICONDUCTOR THIN-FILM TRANSISTOR DEVICE AND METHOD OF MANUFACTURING THE SAME

CROSS-REFERENCE TO RELATED APPLICATIONS

This non-provisional application claims priority under 35 U.S.C. § 119(a) on Patent Application No. 2022-056684 filed in Japan on Mar. 30, 2022, the entire content of which is hereby incorporated by reference.

BACKGROUND

This disclosure relates to an oxide semiconductor thin-film transistor device and a method of manufacturing the oxide semiconductor device.

Application of organic light-emitting diode (OLED) elements is expanding in the field of display devices. An OLED element is a current-driven light-emitting element and therefore, it does not require a backlight.

In addition to this, the OLED element has advantages for achievement of low power consumption, wide viewing angle, and high contrast ratio.

An active-matrix OLED display device includes pixel circuits each including a switching thin-film transistor (TFT) for selecting a pixel (subpixel) and a driving TFT for supplying electric current to an OLED element of the pixel. Amorphous silicon TFTs, polysilicon TFTs, or oxide semiconductor TFTs can be employed for a pixel circuit.

Oxide semiconductor TFTs have increasingly been employed for a pixel circuit of a display device because of their characteristics such as low leakage current and relatively high electron mobility. Oxide semiconductor TFTs are also applied to various fields other than display devices.

SUMMARY

An oxide semiconductor thin-film transistor device includes a substrate, and one or more oxide semiconductor thin-film transistors disposed upper than the substrate. The one or more oxide semiconductor thin-film transistors include a first oxide semiconductor thin-film transistor. The first oxide semiconductor thin-film transistor includes a first oxide semiconductor layer, a first top-gate electrode disposed upper than the first oxide semiconductor layer, and a first source/drain electrode. The first oxide semiconductor layer includes a first channel region overlapping the first top-gate electrode in a planar view, and two first low-resistive regions sandwiching the first channel region. The first source/drain electrode is located upper than the first top-gate electrode and extends through an insulating region overlapping one of the two first low-resistive regions in a planar view to be in contact with the one of the two first low-resistive regions. Each of the two first low-resistive regions and the first channel region includes a lower amorphous layer and an upper crystalline layer having a composition identical to a composition of the amorphous layer.

A method of manufacturing an oxide semiconductor thin-film transistor device includes producing an oxide semiconductor layer, producing a gate insulating layer above the oxide semiconductor layer, producing a top-gate electrode above the gate insulating layer, and producing low-resistive regions in the oxide semiconductor layer by a resistance-reducing process using the top-gate electrode as a mask. The producing an oxide semiconductor layer includes producing a lower amorphous layer, and producing an upper crystalline layer after producing the lower amorphous layer.

It is to be understood that both the foregoing general description and the following detailed description are exemplary and explanatory and are not restrictive of this disclosure.

EMBODIMENTS

Figure 1:
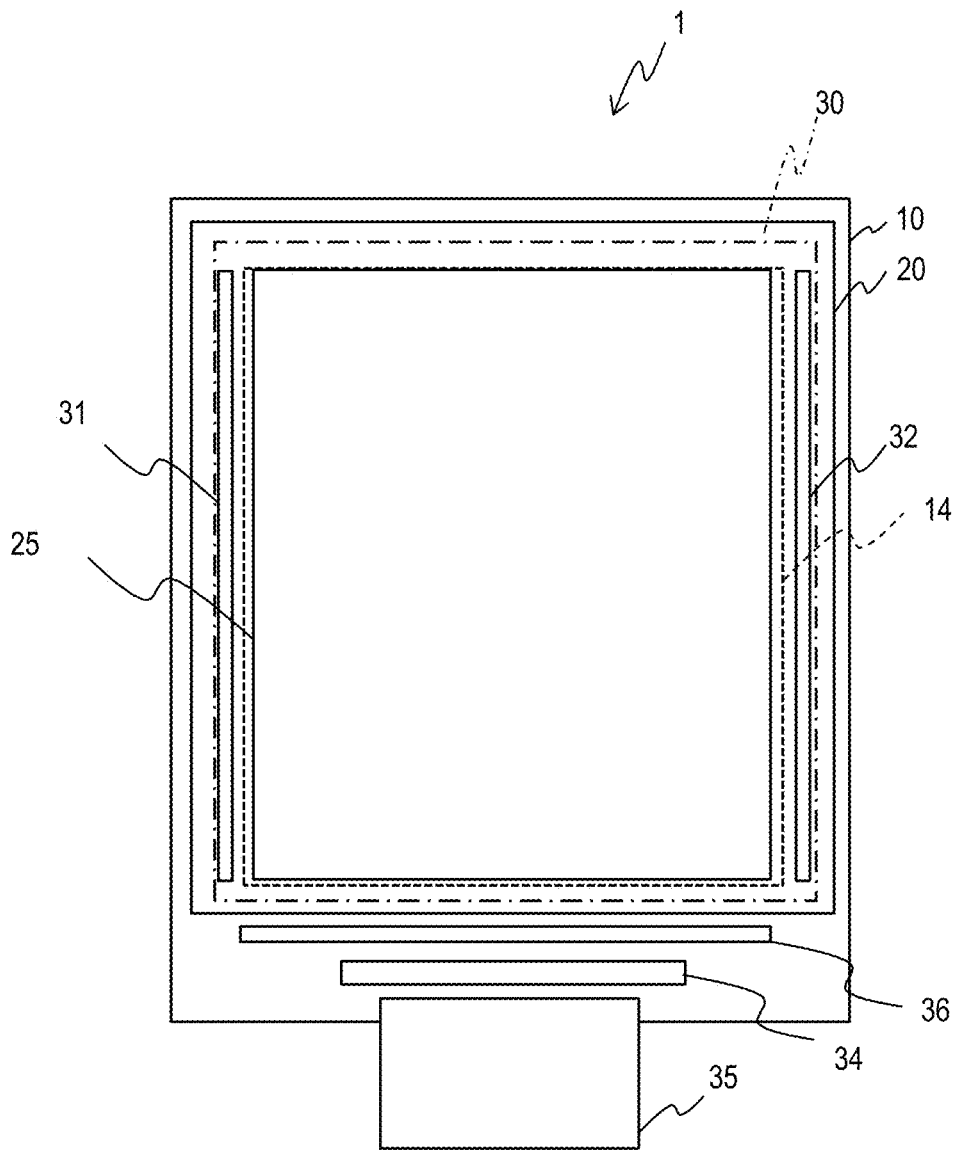
FIG. 1 schematically illustrates a configuration example of an OLED display device.

Hereinafter, embodiments of this disclosure will be described with reference to the accompanying drawings. It should be noted that the embodiments are merely examples to implement the idea of this disclosure and are not to limit the technical scope of this disclosure. Elements common to the drawings are denoted by the same reference signs and each element in the drawings may be exaggerated in size and/or shape for clear understanding of the description.

Overview

The following description employs an organic light-emitting diode (OLED) display device as an example of an oxide semiconductor thin-film transistor (TFT) device. The OLED display device in this disclosure includes oxide semiconductor thin-film transistors (TFTs) in a pixel circuit, for example. The oxide semiconductor layer (active layer) of an oxide semiconductor TFT includes a lower amorphous layer and an upper crystalline layer. This structure of an oxide semiconductor TFT makes it easy to include an oxide semiconductor TFT having a desired characteristic in a circuit. In this specification, the side farther from the substrate is defined as upper side and the side closer to the substrate is defined as lower side.

Furthermore, an optional bottom-gate electrode can be included below the oxide semiconductor layer. Then, a bottom-gate TFT using the lower amorphous layer as a channel and a top-gate TFT using the upper crystalline layer as a channel can be made selectively to provide a circuit taking advantages of their different TFT characteristics. The featured configuration of a circuit including oxide semiconductor TFTs disclosed herein is applicable to pixel circuits or driver circuits in a display device or circuits in devices different from display devices.

Configuration of Display Device

FIG. 1 schematically illustrates a configuration example of an OLED display device 1. The OLED display device 1 includes a thin-film transistor (TFT) substrate 10 on which organic light-emitting elements (OLED elements) are fabricated, an encapsulation substrate 20 for encapsulating the OLED elements, and a bond (glass frit sealer) 30 for bonding the TFT substrate 10 with the encapsulation substrate 20. The space between the TFT substrate 10 and the encapsulation substrate 20 is filled with dry nitrogen and sealed up with the bond 30. The encapsulation substrate 20 and the bond 30 constitute a structural encapsulation unit. The structural encapsulation unit can have a thin-film encapsulation (TFE) structure.

In the periphery of a cathode electrode region 14 outer than the display region 25 of the TFT substrate 10, a scanning driver 31, an emission driver 32, a driver IC 34, and a demultiplexer 36 are provided. The driver IC 34 is connected to the external devices via flexible printed circuits (FPC) 35. The scanning driver 31 and the emission driver 32 are peripheral circuits fabricated on the TFT substrate 10.

The scanning driver 31 drives scanning lines on the TFT substrate 10. The emission driver 32 drives emission control lines to control the light emission periods of pixels. The driver IC 34 is mounted with an anisotropic conductive film (ACF), for example.

The driver IC 34 provides power and timing signals (control signals) to the scanning driver 31 and the emission driver 32 and further, provides power and a data signal to the demultiplexer 36.

The demultiplexer 36 outputs output of one pin of the driver IC 34 to d data lines in turn (d is an integer more than 1). The demultiplexer 36 changes the output data line for the data signal from the driver IC 34 d times per scanning period to drive d times as many data lines as output pins of the driver IC 34.

Configuration of Pixel Circuit

Figures 2A, 2B:
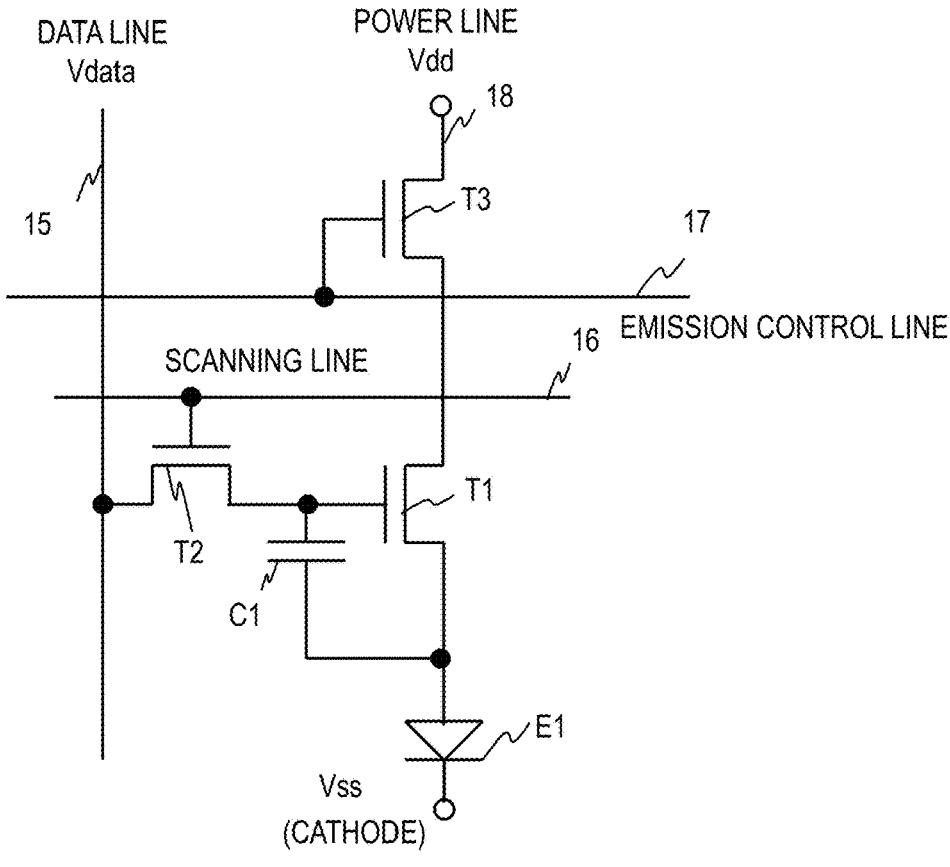
FIG. 2A illustrates a configuration example of a pixel circuit.
FIG. 2B illustrates another configuration example of a pixel circuit.

A plurality of pixel circuits are fabricated on the TFT substrate 10 to control electric current to be supplied to the anode electrodes of subpixels (also simply referred to as pixels). FIG. 2A illustrates a configuration example of a pixel circuit. Each pixel circuit includes a driving transistor T1, a selection transistor T2, an emission transistor T3, and a storage capacitor C1. The storage capacitor C1 is to store a signal voltage to be applied to the gate of the driving transistor T1. The pixel circuit controls light emission of an OLED element E1.

The selection transistor T2 is a switch (switching transistor) for selecting the sub-pixel. The selection transistor T2 is an n-channel type of oxide semiconductor TFT and its gate is connected to a scanning line 16. One source/drain is connected to a data line 15. The other source/drain is connected to the gate of the driving transistor T1.

The driving transistor T1 is a transistor (driving TFT) for driving the OLED element E1. The driving transistor T1 is an n-channel type of oxide semiconductor TFT and its gate is connected to a source/drain of the selection transistor T2. One source/drain of the driving transistor T1 is connected to a source/drain of the emission transistor T3. The other source/drain is connected to the OLED element E1 and the storage capacitor C1. The storage capacitor C1 is located between the gate and the source/drain (source) of the driving transistor T1. The term "source/drain" refers to either a source or a drain; the one having a higher potential becomes the drain and the one having a lower potential becomes the source depending on the operating condition of the oxide semiconductor TFT.

The emission transistor T3 is a switch for controlling supply/stop of the driving current to the OLED element E1. The emission transistor T3 is an n-channel type of oxide semiconductor TFT and its gate is connected to an emission control line 17. One source/drain of the emission transistor T3 is connected to a source/drain of the driving transistor T1. The other source/drain is connected to a power line 18. Illustrated in FIG. 2A is a circuit employing n-channel type of oxide semiconductor TFTs; the potential Vdd (power supply voltage) is set at a positive potential and the potential Vss of the cathode potential is set at a potential lower than the potential Vdd. The emission transistor T3 can be disposed between the OLED element E1 and the driving transistor T1.

Next, operation of the pixel circuit is described. The scanning driver 31 outputs a selection pulse to the scanning line 16 to turn on the selection transistor T2. The data voltage supplied from the driver IC 34 through the data line 15 is stored to the storage capacitor C1. The storage capacitor C1 holds the stored voltage during the period of one frame. The conductance of the driving transistor T1 changes in an analog manner in accordance with the stored voltage, so that the driving transistor T1 supplies a forward bias current corresponding to a light emission level to the OLED element E1.

The emission transistor T3 is located on the supply path of the driving current. The emission driver 32 outputs a control signal to the emission control line 17 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one frame can be controlled by controlling ON/OFF of the transistor T3.

FIG. 2B illustrates another configuration example of a pixel circuit. This pixel circuit includes a reset transistor T4 in place of the emission transistor T3 in FIG. 2A. The reset transistor T4 is an n-channel type of oxide semiconductor TFT. The reset transistor T4 controls the electric connection between a reference voltage supply line 11 and the anode of the OLED element E1. This control is performed in accordance with a reset control signal supplied from a reset control line 19 to the gate of the reset transistor T4. This reset transistor T4 can be used for various purposes.

Figure 2C:
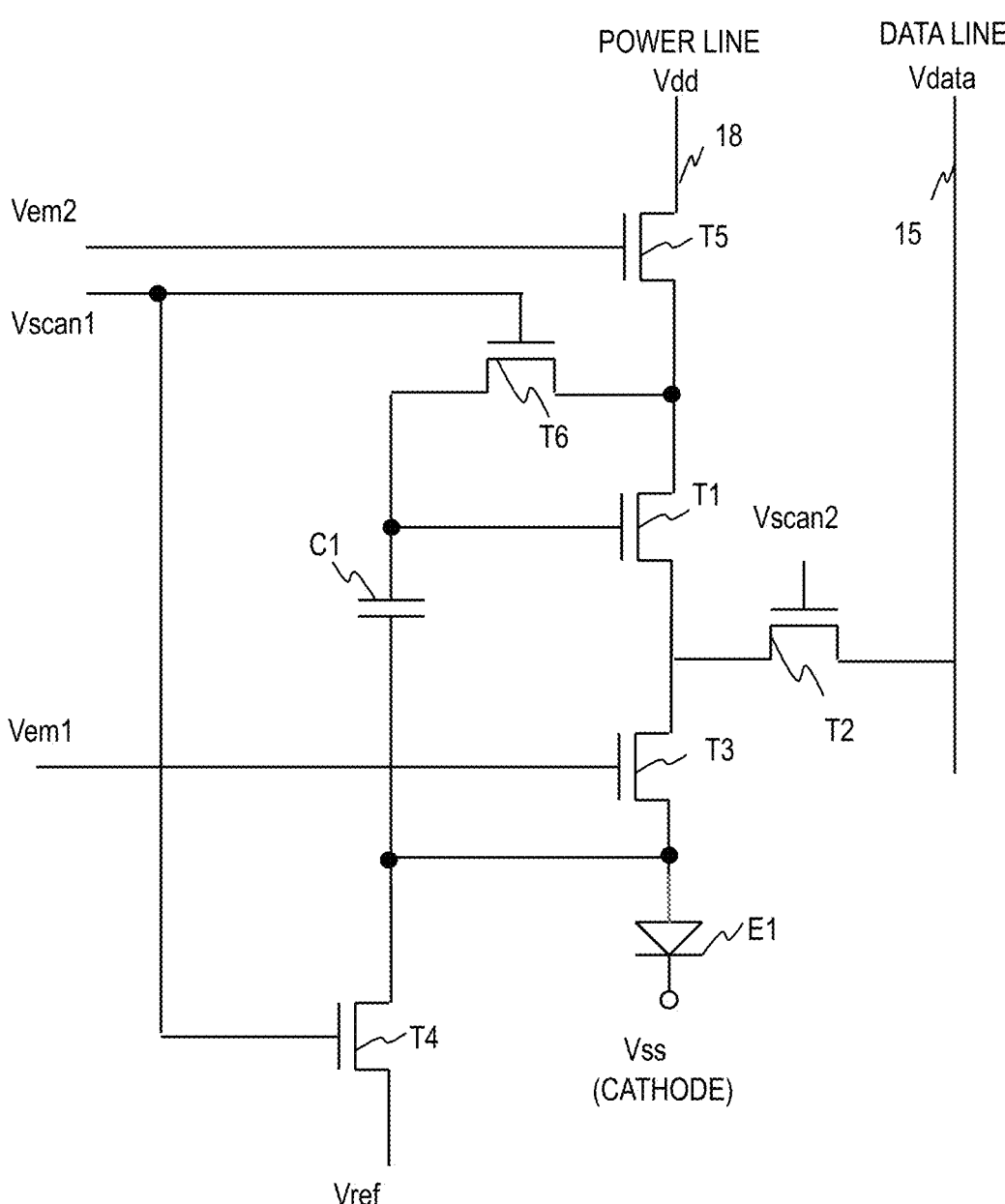
FIG. 2C illustrates still another configuration example of a pixel circuit.

FIG. 2C illustrates still another configuration example of a pixel circuit. This pixel circuit includes n-channel type of transistors T1 to T6. The gate of the transistor T2 is supplied with a Vscan2 signal and the gates of the transistors T4 and T6 are supplied with a Vscan1 signal. A storage capacitor C1 is supplied with a data signal (voltage) through the transistors T2, T1, and T6 to calibrate the threshold voltage of the transistor T1. The transistor T4 supplies a reference voltage Vref to the anode of an OLED element E1. The transistors T3 and T5 are connected to the driving transistor T1 in series and their gates are supplied with signals Vem1 and Vem2 to control whether to light the OLED element E1.

In the circuit configuration in FIG. 2C, the gate of the driving transistor T1 is connected to a source/drain of the switching transistor T6. The storage capacitor C1 is connected to the gate of the driving transistor T1 and a node between a source/drain of the switching transistor T3 and the OLED element E1. The storage capacitor C1 stores the gate voltage (gate-source voltage) for determining the amount of driving current to be supplied by the driving transistor T1.

The foregoing pixel circuits include a driving TFT (T1), a storage capacitor (C1) for storing a signal voltage between a source/drain and the gate of the driving TFT, and a switching TFT (T2 or T6) whose source/drain is connected to the gate of the driving TFT. The circuit illustrated in FIG. 2C further includes switching transistors (for example, T2 and T3) connected in series. The TFT structures described in this specification enable each of the driving TFT and the switching TFTs to have a specific characteristic. The pixel circuit configurations in FIGS. 2A, 2B, and 2C are merely examples; the pixel circuit can have other circuit configurations.

The switching TFT is turned ON/OFF in accordance with the gate signal and therefore, it is demanded to have a characteristic that the drain current rises sharply with respect to the gate voltage (a low S-value [V/dec]). When a switching TFT has a low S-value, the amplitude of the operating voltage (gate voltage) is allowed to be small and as a result, the voltage to be applied to the gate of the TFT can be made small, so that the changes in threshold voltage can be reduced.

In contrast, the driving TFT for controlling the amount of current to the OLED element is demanded to have a characteristic that the drain current rises gently (a high S-value).

When a driving TFT has a high S-value, the driving TFT can use a wide range of data signal (Vdata); the effect of the variations in threshold voltage at lower emission levels (lower gate voltage) can be reduced.

An embodiment of this specification employs oxide semiconductor TFTs for at least one of the transistors in a pixel circuit. The oxide semiconductor layer (active layer) of the oxide semiconductor TFT includes a lower amorphous layer and an upper crystalline layer. The crystalline layer is a polycrystalline layer. In this specification, the side closer to the substrate is defined as lower side and the side farther from the substrate as upper side. Although the oxide semiconductor layer is partially reduced in resistance to exhibit characteristics of a conductor, the layer of the oxide semiconductor, inclusive of the part reduced in resistance, is referred to as oxide semiconductor layer. The oxide semiconductor layer can be made of a metal oxide.

The above-described configuration of the oxide semiconductor layer provides different characteristics to the oxide semiconductor TFT depending on whether the gate voltage for controlling the resistance or current in the channel region is supplied to a top-gate electrode or a bottom-gate electrode. The top-gate electrode is located upper than the oxide semiconductor layer and the bottom-gate electrode is located lower than the oxide semiconductor layer.

Specifically, an oxide semiconductor TFT in which the top-gate electrode controls the characteristics of the channel region exhibits a low S-value. An oxide semiconductor TFT in which the bottom-gate electrode controls the characteristics of the channel region exhibits a high S-value. Oxide semiconductor TFTs having this structure facilitate designing a pixel circuit.

For example, a pixel circuit including an oxide semiconductor TFT having a high S-value (to exhibit a gentle rise of Vg-Id characteristic) as a driving transistor and an oxide semiconductor TFT having a low S-value (to exhibit a sharp rise of Vd-Id characteristic) as a switching transistor shows better performance.

However, a pixel circuit can include only one type of oxide semiconductor TFTs, either the type to be controlled by the voltage of the top-gate electrode or the type to be controlled by the voltage of the bottom-gate electrode. Furthermore, a pixel circuit can include another kind of TFTs such as polysilicon TFTs, in addition to oxide semiconductor TFTs.

An embodiment of this specification produces oxide semiconductor source/drain regions with a self-aligned gate (also referred to simply as self-alignment) that uses the top-gate electrode as a mask. Self-alignment provides an oxide semiconductor TFT having a small feedthrough and moreover, eliminates the need for preparing a mask only for a process.

Structure of Oxide Semiconductor TFT

Hereinafter, examples of the structure of an oxide semiconductor TFT in embodiments of this specification are described. As described above, the oxide semiconductor layer (active layer) of the oxide semiconductor TFT includes a lower amorphous layer and an upper crystalline layer. The crystalline layer is polycrystalline layer. The oxide semiconductor TFT includes a top-gate electrode and one or more source/drain electrodes. The oxide semiconductor TFT can include a bottom-gate electrode in addition to or in place of the top-gate electrode.

The channel region of the oxide semiconductor layer overlap both the top-gate electrode and the bottom-gate electrode in a planar view (in the layering direction). In a planar view, the channel region is included in the regions of the top-gate electrode and the bottom-gate electrode. A gate insulator is interposed between the oxide semiconductor layer and the top-gate electrode and between the oxide semiconductor layer and the bottom-gate electrode.

One of the top-gate electrode and the bottom-gate electrode is supplied with a control voltage for controlling the resistance or the amount of current in the channel region. The other electrode can be in a floating state or supplied with a constant potential. In the case where the oxide semiconductor TFT includes only either a top-gate electrode or a bottom-gate electrode, the electrode is supplied with a control potential from a driver circuit.

The source/drain electrode is in contact with a source/drain region of the oxide semiconductor layer. Their contact region is located outside the top-gate electrode in a planar view. In an embodiment of this specification, the source/drain electrode includes a via region extending through an interlayer insulating layer covering the top-gate electrode; the via region is in contact with the source/drain region. The via region can extend through another insulating layer, such as the insulating layer including the top-gate insulator, in addition to the interlayer insulating layer above the top-gate electrode. This configuration provides a self-aligned gate, enabling efficient manufacture of an oxide semiconductor TFT having good characteristics.

Figure 3:
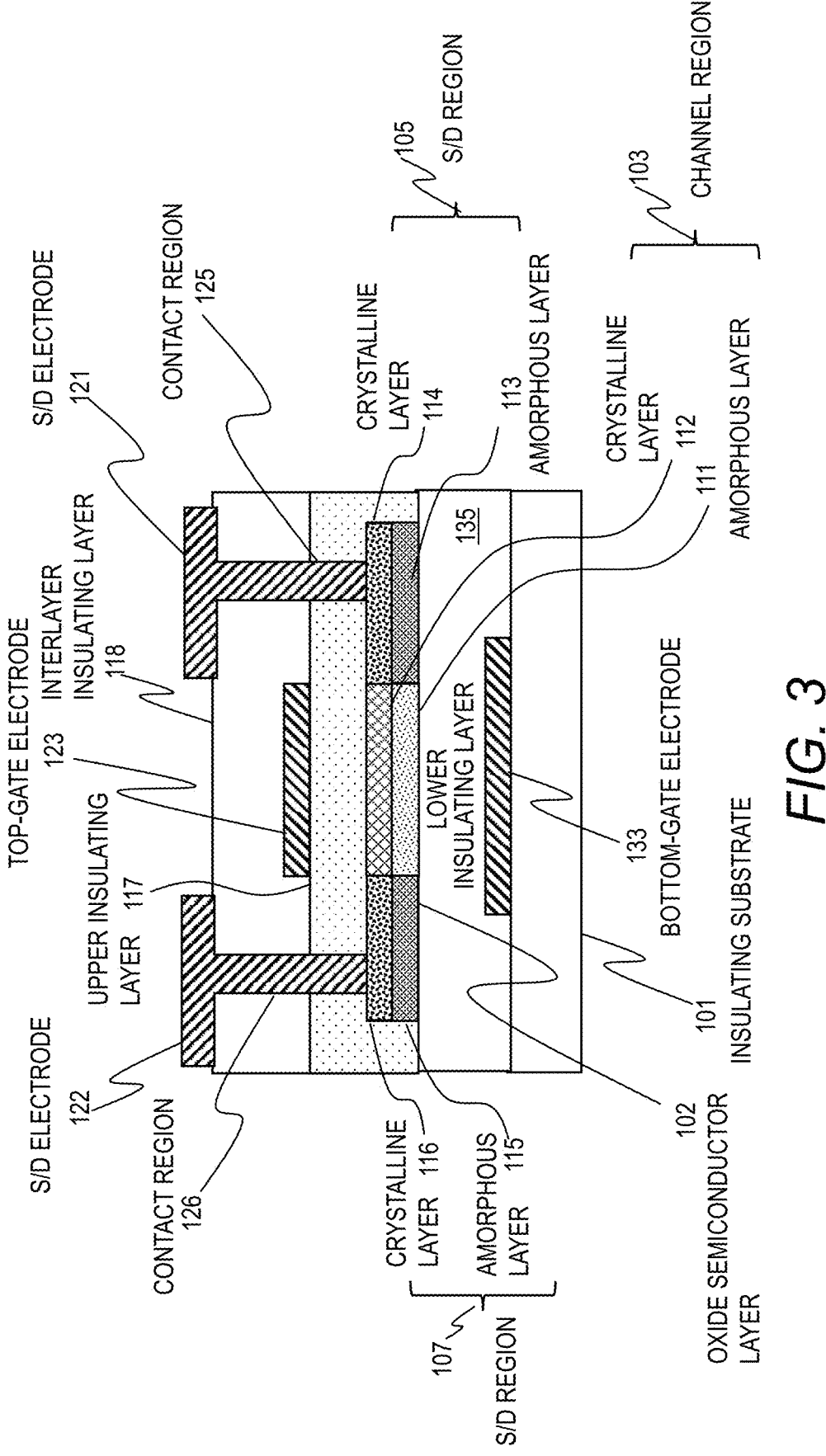
FIG. 3 schematically illustrates a configuration example of an oxide semiconductor TFT in an embodiment of this specification.

FIG. 3 schematically illustrates a configuration example of an oxide semiconductor TFT in an embodiment of this specification. The configuration example of an oxide semiconductor TFT in FIG. 3 includes a top-gate electrode 123 and a bottom-gate electrode 133. This oxide semiconductor TFT is applicable to both a driving transistor and a switching transistor.

In the case of using the oxide semiconductor TFT as a driving transistor, the potential for controlling the channel can be supplied to the bottom-gate electrode 133 and the top-gate electrode 123 can be supplied with a constant potential. In the case of using the oxide semiconductor TFT as a switching transistor, the potential for controlling the channel can be supplied to the top-gate electrode 123 and the bottom-gate electrode 133 can be supplied with a constant potential. In the case of using the oxide semiconductor TFT as a switching transistor, the bottom-gate electrode 133 can be excluded.

The oxide semiconductor TFT is fabricated on a flexible or a rigid insulating substrate 101 made of resin or glass. The oxide semiconductor TFT includes the bottom-gate electrode 133 and a lower insulating layer 135 located between the bottom-gate electrode 133 and an oxide semiconductor layer 102. A not-shown insulating layer can be provided between the bottom-gate electrode 133 and the insulating substrate 101. The bottom-gate electrode 133 is made of a conductor, for example a metal having a high-melting point such as W, Mo, and Ta or an alloy thereof.

The oxide semiconductor layer 102 includes source/drain regions (S/D regions) 105 and 107 and a channel region 103 located between the source/drain regions 105 and 107 in an in-plane direction. A part of the lower insulating layer 135 is a bottom-gate insulator located between the bottom-gate electrode 133 and the channel region 103.

The lower insulating layer 135 can be a silicon oxide layer or a stack of silicon oxide (an upper layer) and silicon nitride (a lower layer). The oxide semiconductor layer 102 is provided directly above (in contact with) the lower insulating layer 135. The source/drain regions 105 and 107 are regions reduced in resistance. The channel region 103 is a region not reduced in resistance. Reduction in resistance will be described later.

The oxide semiconductor layer 102 can be made of a metal oxide. An example of the metal oxide is indium gallium zinc oxygen (IGZO).

Other examples of the oxide semiconductor material include materials having high mobility such as indium gallium zinc tin oxide (IGZTO), indium zinc oxide (IZO) and materials having low mobility such as zinc oxide (ZnO).

The oxide semiconductor layer 102 includes a lower amorphous layer and an upper crystalline layer. Specifically, the channel region 103 consists of an amorphous layer 111 and a crystalline layer 112; the source/drain region 105 consists of an amorphous layer 113 and a crystalline layer 114; and the source/drain region 107 consists of an amorphous layer 115 and a crystalline layer 116. FIG. 3 is a schematic diagram; the actual interface between an amorphous layer and a crystalline layer is not flat but has a more complex geometry.

The channel region 103 and the source/drain regions 105 and 107 have identical compositions. The amorphous layer and the crystalline layer in each region are in different states of order but their compositions are identical.

The bottom-gate electrode 133 is opposed to the channel region 103 across the lower insulating layer 135. The bottom-gate electrode 133, the lower insulating layer 135, and the channel region 103 are laid one above another in this order from the bottom (the side closer to the substrate). The lower insulating layer 135 is partially in contact with the channel region 103 and the bottom-gate electrode 133. The part of the lower insulating layer 135 in contact with the channel region 103 and the bottom-gate electrode 133 corresponds to the bottom-gate insulator of the oxide semiconductor TFT.

The oxide semiconductor TFT further includes the top-gate electrode 123 and a region of an upper insulating layer 117 located between the top-gate electrode 123 and the channel region 103 in the layering direction. The top-gate electrode 123 is made of a conductor, for example a metal having a high-melting point such as W, Mo, and Ta or an alloy thereof.

The upper insulating layer 117 covers the oxide semiconductor layer 102. The upper insulating layer 117 can be a silicon oxide layer, a silicon nitride layer, or a stack of these. The oxide semiconductor layer 102, the upper insulating layer 117, and the top-gate electrode 123 are laid one above another in this order from the bottom (the side closer to the substrate). The upper insulating layer 117 is in contact with the lower insulating layer 135, the oxide semiconductor layer 102, and the top-gate electrode 123. The part of the upper insulating layer 117 in contact with the top-gate electrode 123 and the channel region 103 corresponds to a top-gate insulator.

In the case of using the oxide semiconductor TFT as a driving transistor, the data signal (signal voltage) for controlling the driving current to the OLED element is supplied to the bottom-gate electrode 133. The top-gate electrode 123 is supplied with a constant potential or kept in an electrically floating state. In the case of using the oxide semiconductor TFT as a switching transistor, the control signal for turning ON/OFF the transistor is supplied to the top-gate electrode 123. The bottom-gate electrode 133 is supplied with a constant potential or kept in an electrically floating state. Alternatively, the bottom-gate electrode 133 can be excluded. As will be described later, the top-gate electrode 123 is used as a mask to reduce the resistance of the source/drain regions 105 and 107 (self-alignment).

The oxide semiconductor TFT includes an interlayer insulating layer 118 above the top-gate electrode 123. The interlayer insulating layer 118 covers the top-gate electrode 123 and is in contact with the top-gate electrode 123 and the upper insulating layer 117. The interlayer insulating layer 118 can be a silicon insulating layer or a multilayered structure of different insulating materials.

The oxide semiconductor TFT includes source/drain electrodes 121 and 122 sandwiching the top-gate electrode 123 in an in-plane direction. The source/drain electrodes 121 and 122 are made of conductor; for example, they can be a single aluminum layer or a multilayered structure of Ti/Al/Ti.

The source/drain electrode 121 includes a contact region 125 extending through the interlayer insulating layer 118 and the upper insulating layer 117. The contact region 125 is in contact with (directly connected to) the source/drain region 105 in a contact hole opened through the interlayer insulating layer 118 and the upper insulating layer 117.

The source/drain electrode 122 includes a contact region 126 extending through the interlayer insulating layer 118 and the upper insulating layer 117. The contact region 126 is in contact with (directly connected to) the source/drain region 107 in a contact hole opened through the interlayer insulating layer 118 and the upper insulating layer 117.

The contact regions 125 and 126 extend through the interlayer insulating layer 118 and the upper insulating layer 117 in the regions outside the top-gate electrode 123 in a planar view and do not overlap the top-gate electrode 123 in a planar view. The top regions of the source/drain electrodes 121 and 122 are in direct contact with the top face of the interlayer insulating layer 118. In the configuration example of FIG. 3, the source/drain electrodes 121 and 122 are disposed not to overlap the top-gate electrode 123 in a planar view.

Figure 4:
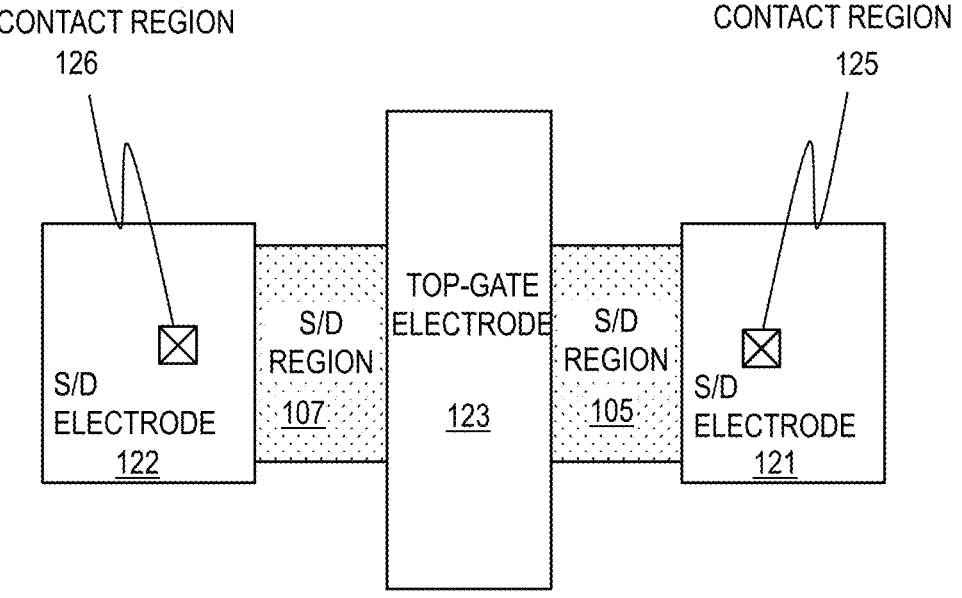
FIG. 4 is a plan diagram schematically illustrating the structure of the top face of the oxide semiconductor TFT illustrated in FIG. 3.

FIG. 4 is a plan diagram schematically illustrating the structure of the top face of the oxide semiconductor TFT illustrated in FIG. 3. FIG. 4 illustrates an appearance of the oxide semiconductor TFT in a planar view (when viewed in the layering direction). As illustrated in FIG. 4, the source/drain electrodes 121 and 122 are located outside the top-gate electrode 123 without an overlap when viewed planarly from above.

Figure 5:
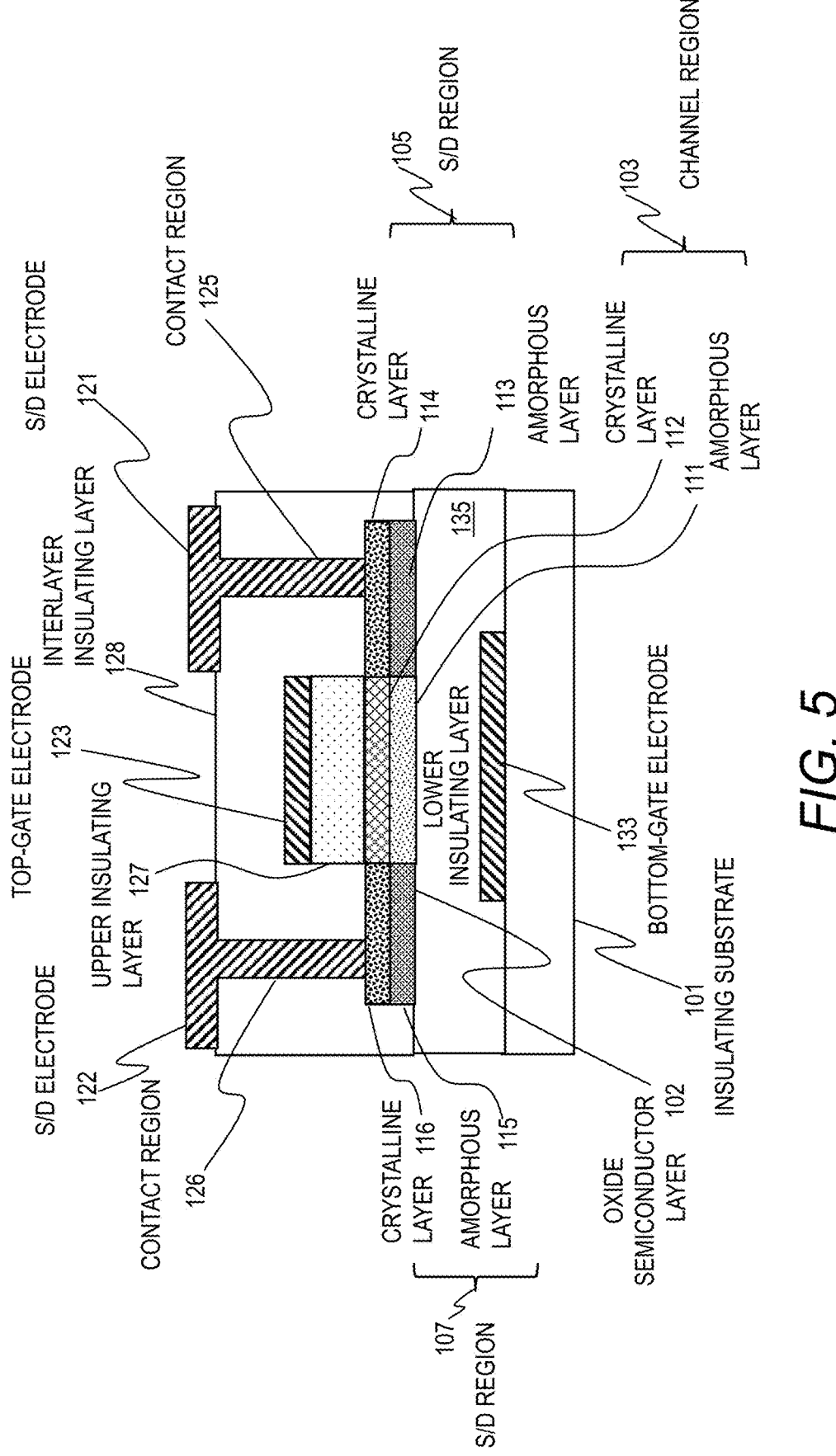
FIG. 5 schematically illustrates a configuration example of an oxide semiconductor TFT in another embodiment of this specification.

FIG. 5 schematically illustrates a configuration example of an oxide semiconductor TFT in another embodiment of this specification. Differences from the configuration example in FIG. 3 are mainly described. The upper insulating layer 127 is etched and does not cover the source/drain regions 105 and 107 in a planar view. The upper insulating layer 127 covers the channel region 103. A part or all of the upper insulating layer 127 corresponds to the top-gate insulator located between the channel region 103 and the top-gate electrode 123.

The source/drain regions 105 and 107 are exposed from the upper insulating layer 127 to the interlayer insulating layer 128. The interlayer insulating layer 128 is in contact with and covers the source/drain regions 105 and 107. The contact region 125 of the source/drain electrode 121 extends through the interlayer insulating layer 128 and is in contact with (directly connected to) the source/drain region 105 in a hole of the interlayer insulating layer 128. The contact region 126 of the source/drain electrode 122 extends through the interlayer insulating layer 128 and is in contact with (directly connected to) the source/drain region 107 in a hole of the interlayer insulating layer 128.

Figure 6:
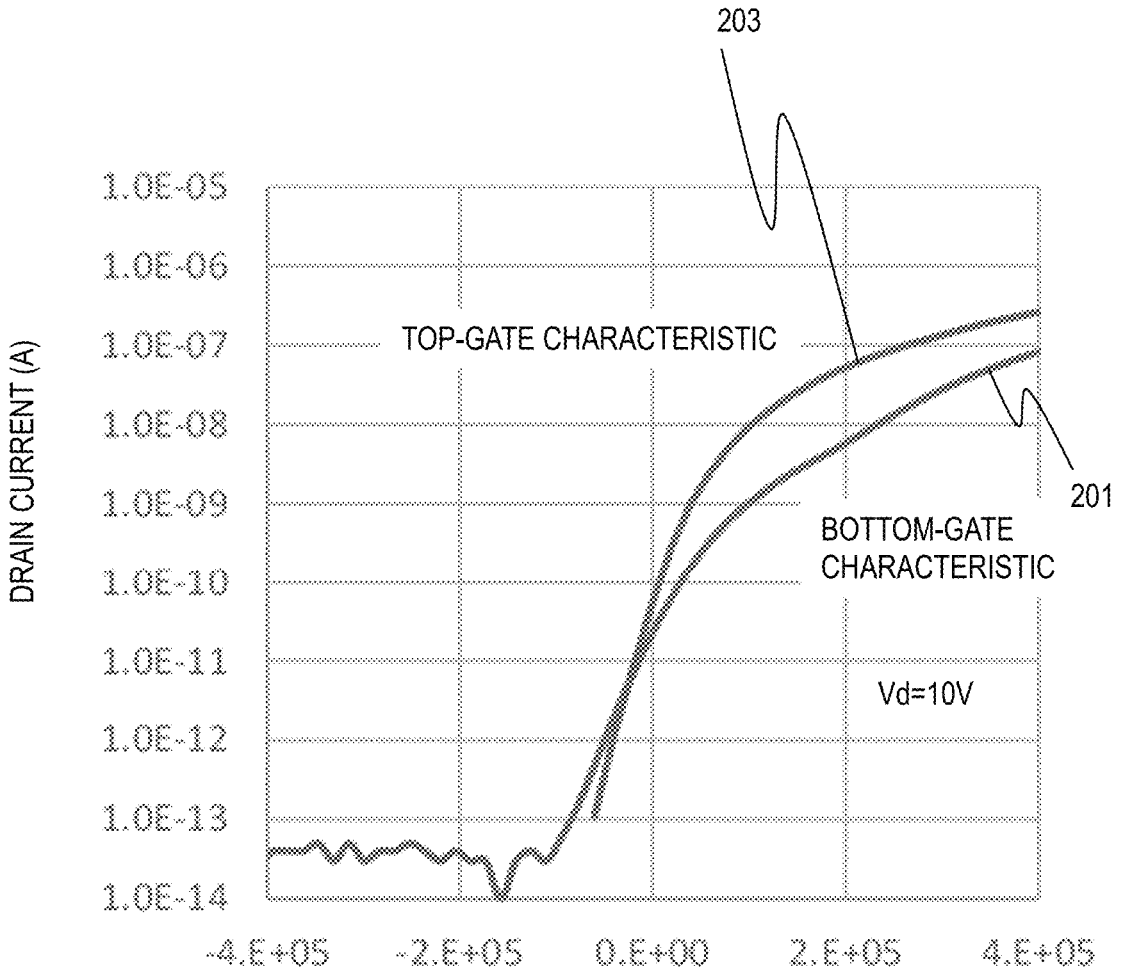
FIG. 6 provides results of measurement of a top-gate characteristic and a bottom-gate characteristic of an oxide semiconductor TFT having the configuration illustrated in FIG. 3.

FIG. 6 provides results of measurement of a top-gate characteristic and a bottom-gate characteristic of an oxide semiconductor TFT having the configuration illustrated in FIG. 3. In the graph of FIG. 6, the horizontal axis represents the electric field applied from the top-gate electrode or the bottom-gate electrode and the vertical axis represents the drain current. The curve 203 represents the top-gate characteristic and the curve 201 represents the bottom-gate characteristic. The source-drain voltage Vd was 10 V.

The bottom-gate characteristic is expressed by the variation in drain current with respect to variation in intensity of the electric field between the bottom-gate electrode and the oxide semiconductor layer. In measuring the bottom-gate characteristic, the top-gate electrode was in a floating state. The top-gate characteristic is expressed by the variation in drain current with respect to variation in intensity of the electric field between the top-gate electrode and the oxide semiconductor layer. In measuring the top-gate characteristic, the bottom-gate electrode was in a floating state.

As noted from FIG. 6, bottom-gate driving provides a large S-value; the rise of the drain current is gentle, compared to top-gate driving. For this reason, the bottom-gate driving is advantageous in using the oxide semiconductor TFT as a driving transistor. In contrast, top-gate driving provides a smaller S-value; the rise of the drain current is sharp. The top-gate driving provides a good switching characteristic and it is advantageous in using the oxide semiconductor TFT as a switching transistor.

Manufacturing Method

Examples of the method of manufacturing an oxide semiconductor TFT are described. FIGS. 7A to 7D schematically illustrate an example of the method of manufacturing the oxide semiconductor TFT illustrated in FIG. 3. This method implants impurities to the oxide semiconductor through the upper insulating layer to reduce the resistance of the source/drain regions.

Figure 7A:
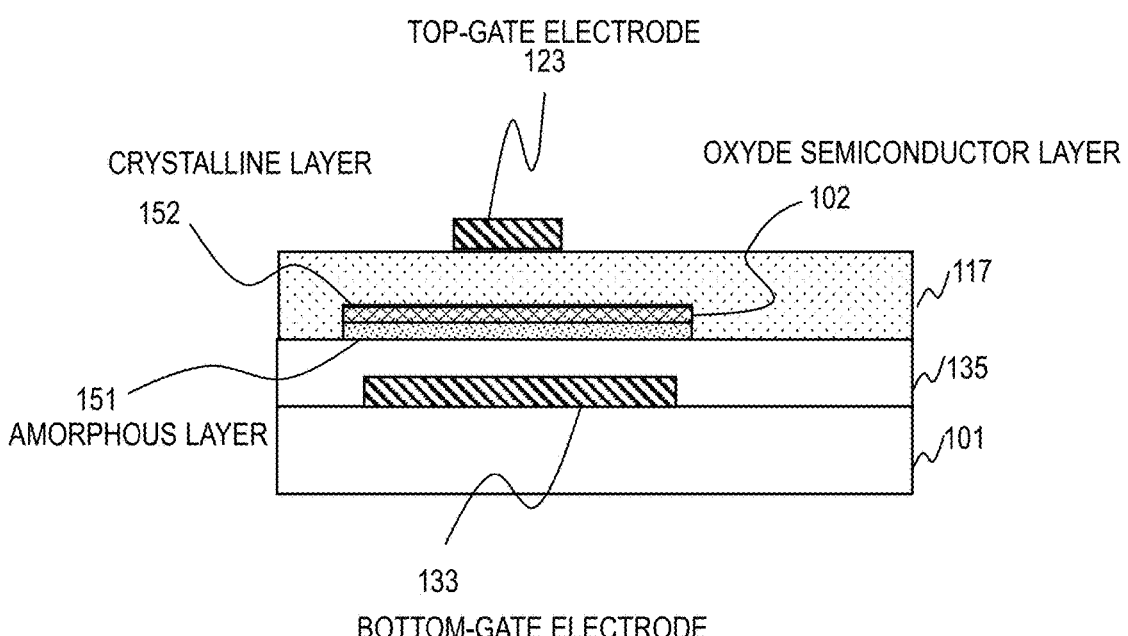
FIG. 7A illustrates some steps of an example of the method of manufacturing the oxide semiconductor TFT illustrated in FIG. 3.

With reference to FIG. 7A, the manufacturing method produces a bottom-gate electrode 133 on an insulating substrate 101. This step deposits a metal layer by sputtering and forms a bottom-gate electrode 133 by photolithography and etching. The metal material can be selected desirably, for example, from Mo, W, Nb, and Al.

Further, the manufacturing method deposits a lower insulating layer (for example, a silicon oxide layer) 135 by chemical vapor deposition (CVD) and subsequently, produces an oxide semiconductor layer 102. The oxide semiconductor layer 102 can be produced by depositing an oxide semiconductor by sputtering and patterning the oxide semiconductor film by photolithography.

The step of producing the oxide semiconductor layer 102 produces a lower amorphous layer 151 and an upper crystalline layer 152. The upper-crystalline/lower-amorphous structure can be produced by appropriately determining the condition of the sputtering gas. For example, the sputtering apparatus introduces a mixture gas of oxygen and argon into a chamber in which an oxide semiconductor target is placed. The proportion ($O_2/(Ar+O_2)$) of the oxygen gas to the mixture gas of oxygen and argon to be introduced can be ranged from 30% to 60%, for example.

A high voltage is applied between the substrate on which the oxide semiconductor is to be deposited and the oxide semiconductor target. Any sputtering scheme such as DC sputtering, RF sputtering, or magnetron sputtering can be employed. An oxide semiconductor layer having an upper-crystalline/lower-amorphous structure can be produced by reactive sputtering with oxygen as described above.

Next, the manufacturing method deposits an upper insulating layer 117 by CVD, for example. Thereafter, the manufacturing method deposits a metal film by sputtering and forms a top-gate electrode 123 by etching the metal film with a mask patterned by photolithography. The metal material can be selected desirably, for example, from Mo, W, Nb, and Al.

Figure 7B:
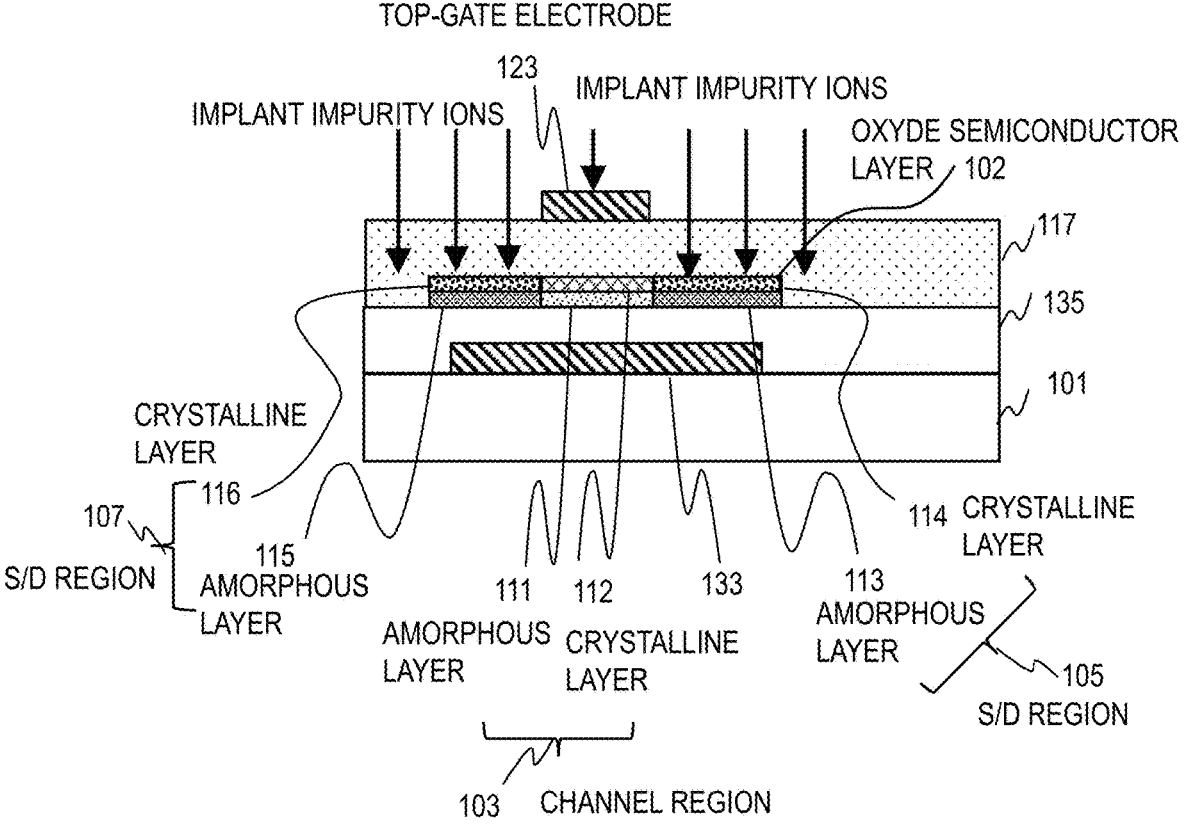
FIG. 7B illustrates a step of an example of the method of manufacturing the oxide semiconductor TFT illustrated in FIG. 3.

With reference to FIG. 7B, the manufacturing method implants impurities (for example, boron ions) to the oxide semiconductor layer 102 through the upper insulating layer 117 using the top-gate electrode 123 as a mask. Implanting impurity ions produces low-resistive source/drain regions 105 and 107 in the oxide semiconductor layer 102.

The source/drain regions 105 and 107 are regions outside the top-gate electrode 123; they are doped with impurity ions and reduced in resistance. The source/drain region 105 consists of a lower amorphous layer 113 and an upper crystalline layer 114 and the source/drain region 107 consists of a lower amorphous layer 115 and an upper crystalline layer 116. Implanting impurity ions increases oxygen vacancies in the source/drain regions 105 and 107 and lowers the resistance there. As will be described later, implanting impurity ions lowers the degree of orientation in the source/drain regions 105 and 107 to lower the resistance there.

A highly-resistive region is a channel region 103. The channel region 103 is not exposed to impurity ions. Accordingly, its lower amorphous layer 111 and upper crystalline layer 112 have the same characteristics of the amorphous layer 151 and the crystalline layer 152 before impurity ion implantation. The high resistance of the channel region 103 is maintained. As described above, the low-resistive regions are produced by self-alignment using the top-gate electrode 123 as a mask.

Figure 7C:
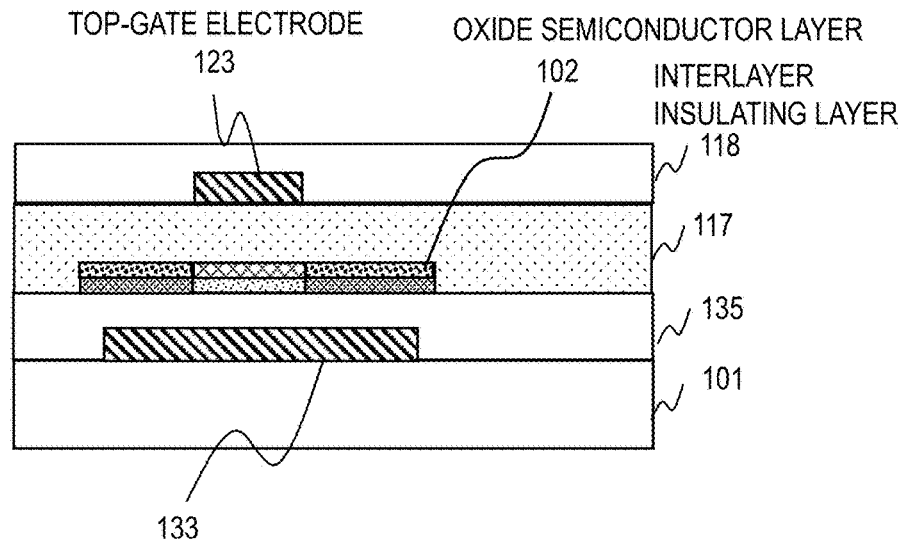
FIG. 7C illustrates a step of an example of the method of manufacturing the oxide semiconductor TFT illustrated in FIG. 3.

With reference to FIG. 7C, the manufacturing method deposits an interlayer insulating layer 118 to cover the top-gate electrode 123 and the upper insulating layer 117. The interlayer insulating layer 118 can be produced by depositing one or more insulating layers of silicon oxide or silicon nitride by CVD, for example.

Figure 7D:
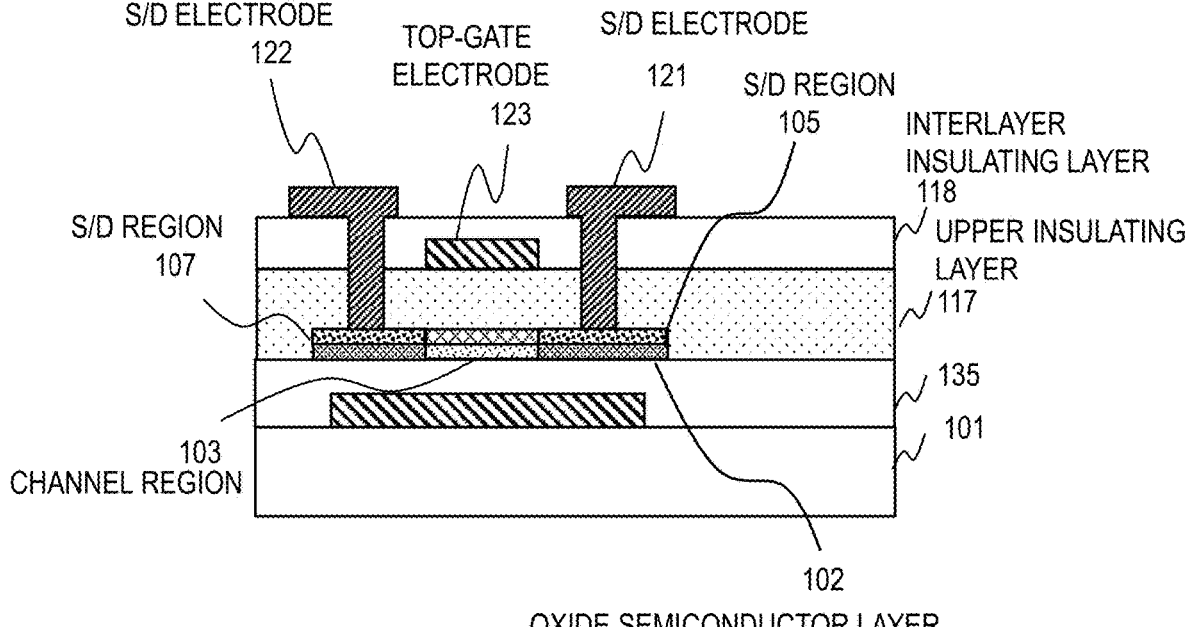
FIG. 7D illustrates some steps of an example of the method of manufacturing the oxide semiconductor TFT illustrated in FIG. 3.

With reference to FIG. 7D, the manufacturing method opens contact holes through the interlayer insulating layer 118 and the upper insulating layer 117 at locations outside the top-gate electrode 123 in a planar view by etching the insulating layers 118 and 117 with a mask patterned by photolithography. The contact holes penetrate the interlayer insulating layer 118 and the upper insulating layer 117 at locations not overlapping the top-gate electrode 123 to expose the source/drain regions 105 and 107 of the oxide semiconductor layer 102.

Further, the manufacturing method deposits a metal film by sputtering and forms source/drain electrodes 121 and 122 by etching the metal film with a mask patterned by photolithography. The source/drain electrodes 121 and 122 extend through the interlayer insulating layer 118 and the upper insulating layer 117 and contact the top faces of the source/drain regions 105 and 107.

Next, another example of a method of manufacturing an oxide semiconductor TFT is described. FIGS. 8A to 8D schematically illustrate an example of the method of manufacturing the oxide semiconductor TFT illustrated in FIG. 5. This method exposes the exposed regions of an oxide semiconductor to plasma to reduce the resistance in the source/drain regions. The following mainly describes differences from the description provided with reference to FIGS. 7A to 7D.

Figure 8A:
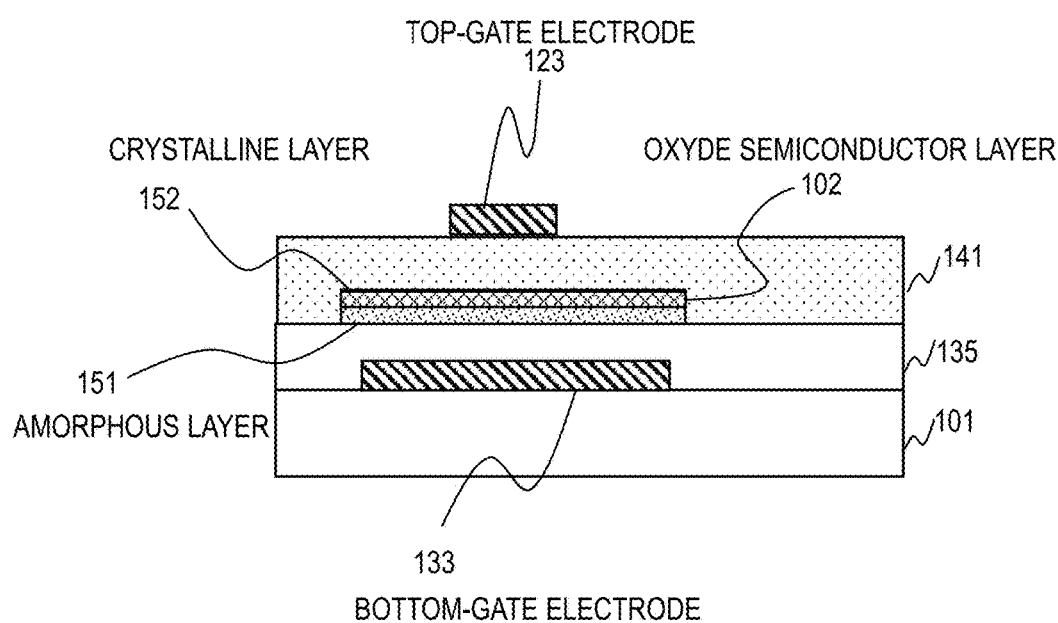
FIG. 8A illustrates some steps of an example of the method of manufacturing the oxide semiconductor TFT illustrated in FIG. 5.

FIG. 8A is substantially the same as FIG. 7A; an insulating layer 141 is provided in place of the upper insulating layer 117. The shape and the production of the insulating layer 141 are the same as those of the upper insulating layer 117. The other components are the same as those in FIG. 7A; they can be produced by the same method as described with reference to FIG. 7A.

Figure 8B:
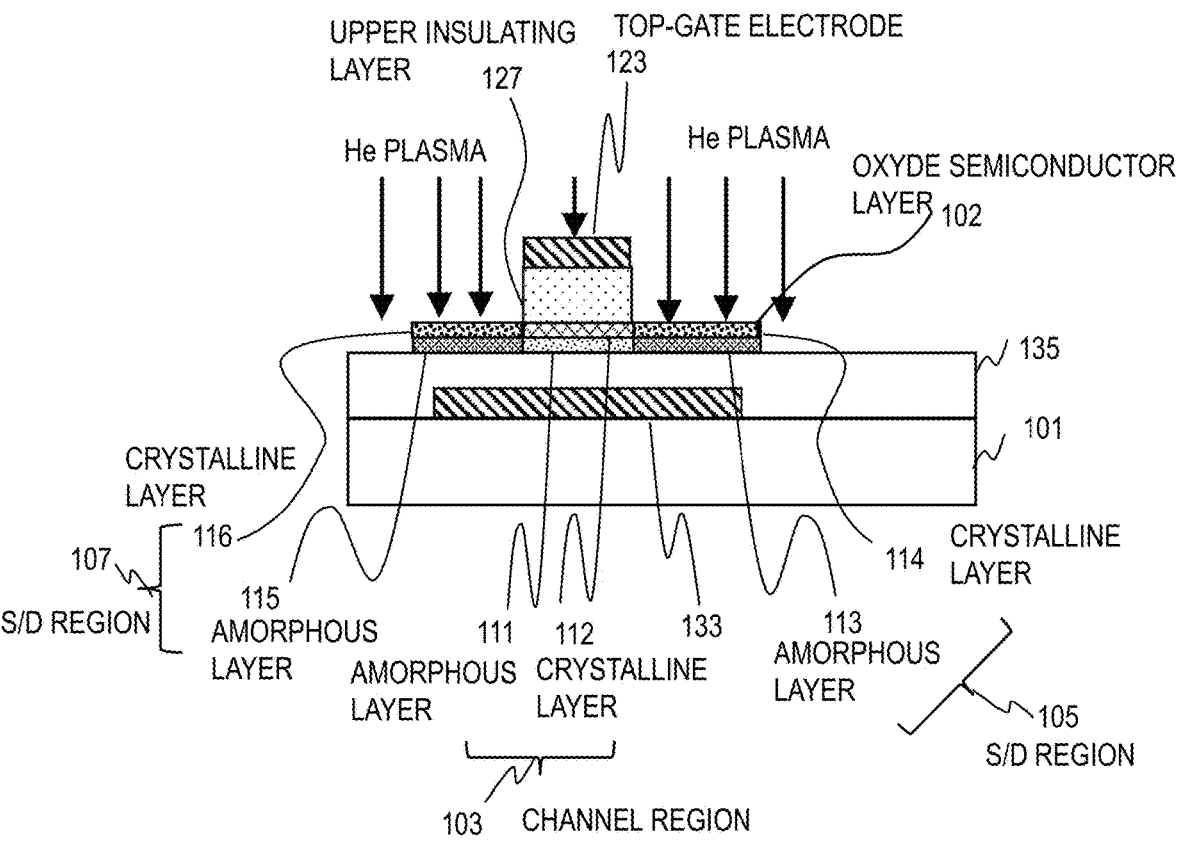
FIG. 8B illustrates a step of an example of the method of manufacturing the oxide semiconductor TFT illustrated in FIG. 5.

With reference to FIG. 8B, the manufacturing method forms an upper insulating layer 127 by etching the insulating layer 141 using the top-gate electrode 123 as a mask. As a result, the oxide semiconductor layer 102 is partially exposed. The manufacturing method exposes the exposed regions of the oxide semiconductor layer 102 to He plasma to reduce the resistance there. Low-resistive source/drain regions 105 and 107 are thus produced.

The structure of the source/drain regions 105 and 107 are as described with reference to FIG. 7B. Exposing the source/drain regions 105 and 107 to He plasma increases oxygen vacancies in the source/drain regions 105 and 107 to lower the resistance there. As will be described later, exposure to He plasma lowers the degree of orientation in the source/drain regions 105 and 107 to lower the resistance there.

A highly-resistive region is a channel region 103. The channel region 103 is not exposed to He plasma. Accordingly, its lower amorphous layer 111 and upper crystalline layer 112 have the same characteristics of the amorphous layer 151 and the crystalline layer 152 before the source/drain regions 105 and 107 are exposed to He plasma. The high resistance of the channel region 103 is maintained. As described above, low-resistive regions are produced by self-alignment using the top-gate electrode 123 as a mask.

Figure 8C:
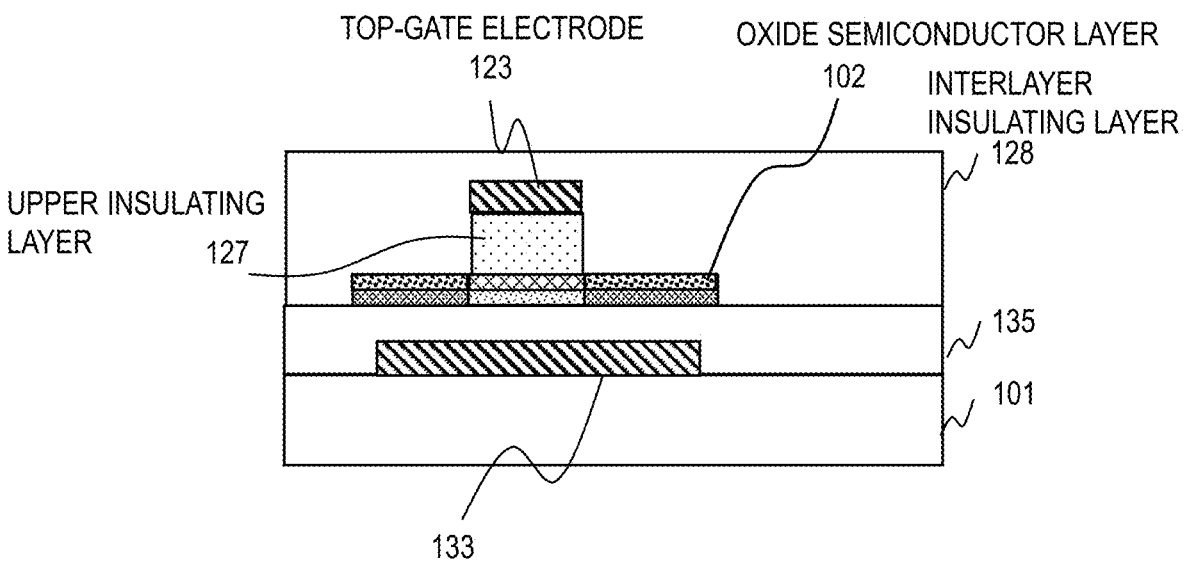
FIG. 8C illustrates a step of an example of the method of manufacturing the oxide semiconductor TFT illustrated in FIG. 5.

With reference to FIG. 8C, the manufacturing method deposits an interlayer insulating layer 128 to cover the top-gate electrode 123 and the upper insulating layer 127. The interlayer insulating layer 128 can be produced by depositing one or more insulating layers of silicon oxide or silicon nitride by CVD, for example.

Figure 8D:
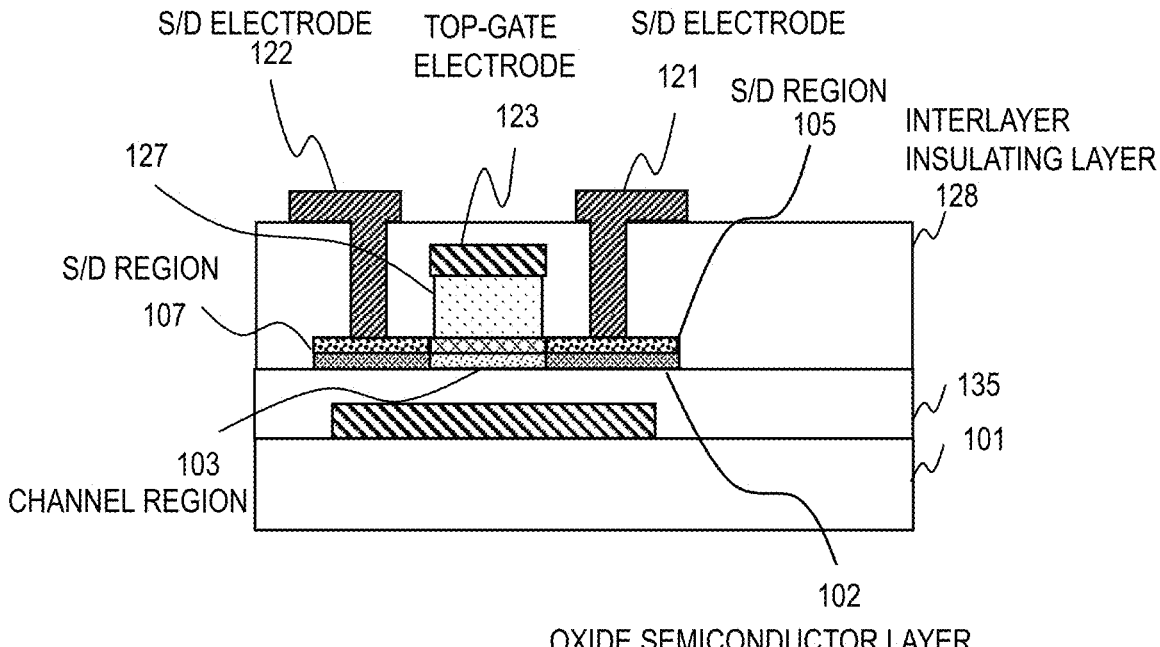
FIG. 8D illustrates some steps of an example of the method of manufacturing the oxide semiconductor TFT illustrated in FIG. 5.

With reference to FIG. 8D, the manufacturing method opens contact holes through the interlayer insulating layer 128 at locations outside the top-gate electrode 123 in a planar view by etching the insulating layer 128 with a mask patterned by photolithography. The contact holes penetrate the interlayer insulating layer 128 at locations not overlapping the top-gate electrode 123 to expose the source/drain regions 105 and 107 of the oxide semiconductor layer 102.

Further, the manufacturing method deposits a metal film by sputtering and forms source/drain electrodes 121 and 122 by etching the metal film with a mask patterned by photolithography. The source/drain electrodes 121 and 122 extend through the interlayer insulating layer 128 and contact the top faces of the source/drain regions 105 and 107.

Manufacturing an OLED display device produces OLED elements and a structural encapsulation unit after producing transistors in pixel circuits as described above. For example, after forming a metal layer including source/drain electrodes, the manufacturing method deposits another insulating layer (for example, a silicon oxide layer) by CVD, forms a passivation layer by photolithography and etching, and further deposits an overcoat layer of organic substance.

Next, the manufacturing method produces anode electrodes on the overcoat layer and connects each anode electrode to a source/drain region through a contact hole opened through the passivation layer and the overcoat layer. An example of an anode electrode consists of three layers of a transparent conductive film, a reflective metal film, and another transparent conductive film. The transparent conductive material can be ITO or IZO. The reflective metal material can be Ag, Mg, or Al. The anode electrodes can be formed by sputtering and etching.

The manufacturing method further deposits a photosensitive organic resin film by spin coating and patterns the photosensitive organic resin film to form a pixel defining layer. Holes are opened through the pixel defining layer to expose the anode electrodes at the bottom of the holes. The pixel defining layer separates light-emitting regions of sub-pixels. The manufacturing method deposits organic light-emitting materials specific to the color of red, green, or blue on each anode electrode and further, deposits a cathode electrode on the entire region of the substrate. Thereafter, the manufacturing method produces a structural encapsulation unit.

Measurement Results by Electron Diffraction Method

Measurement results by an electron diffraction method acquired from an oxide semiconductor TFT in an embodiment of this specification are described. The electron diffraction measurement used a transmission electron microscope (TEM). The measurement irradiated the oxide semiconductor layer of an oxide semiconductor TFT with an electron beam to acquire a diffraction pattern and generated diffraction pattern data and an azimuthal distribution graph, which are described in the following. The measurement results indicate that the oxide semiconductor layer consists of a lower amorphous layer and an upper crystalline layer and further, the degree of orientation in the low-resistive regions (source/drain regions) is lower than that in the highly-resistive region (channel region).

Figure 9A:
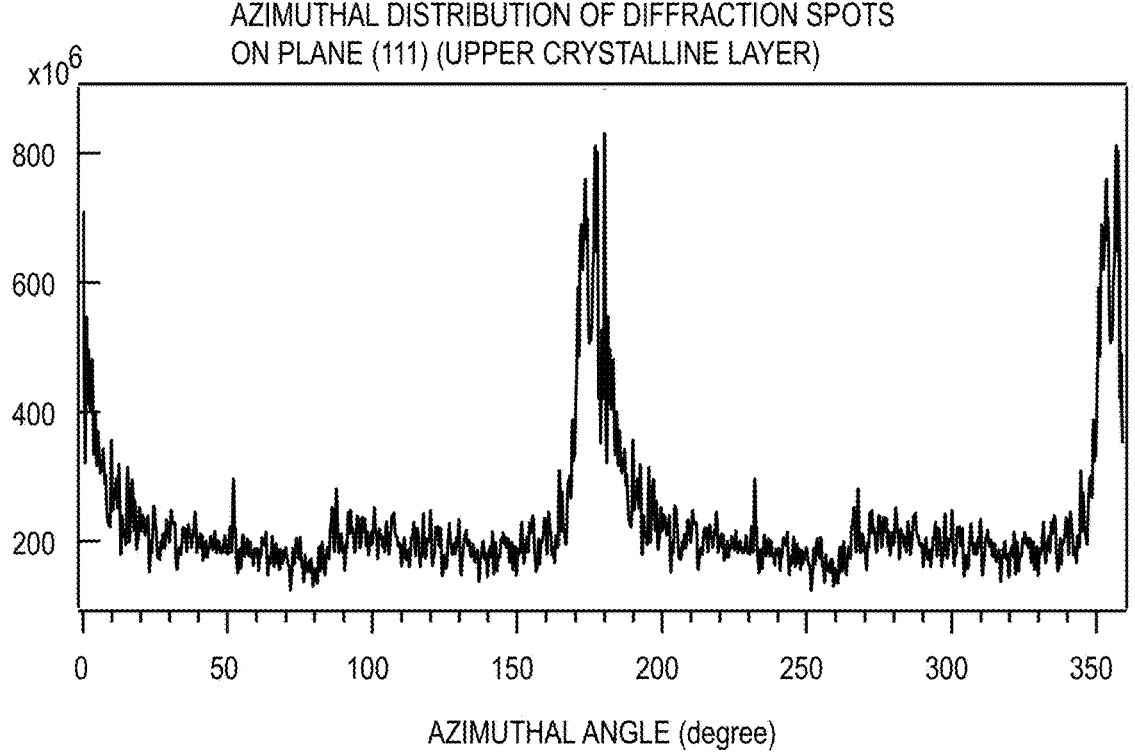
FIG. 9A illustrates an azimuthal distribution of diffraction spots on the plane (111) of an upper crystal layer.
Figure 9B:
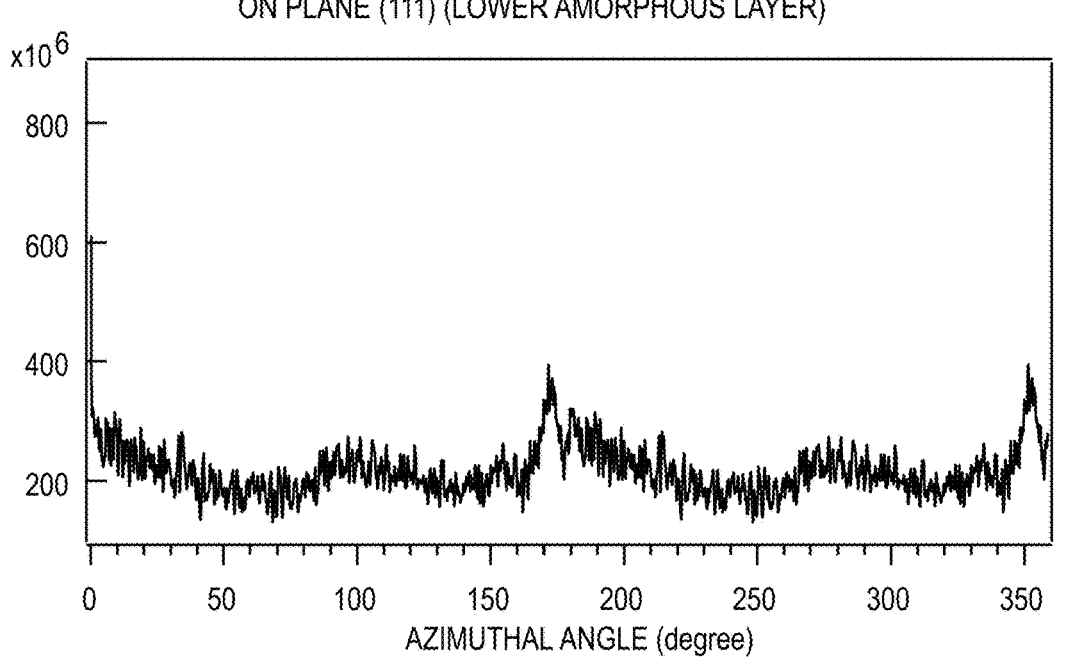
FIG. 9B illustrates an azimuthal distribution of diffraction spots on the plane (111) of a lower amorphous layer.
Figure 9C:
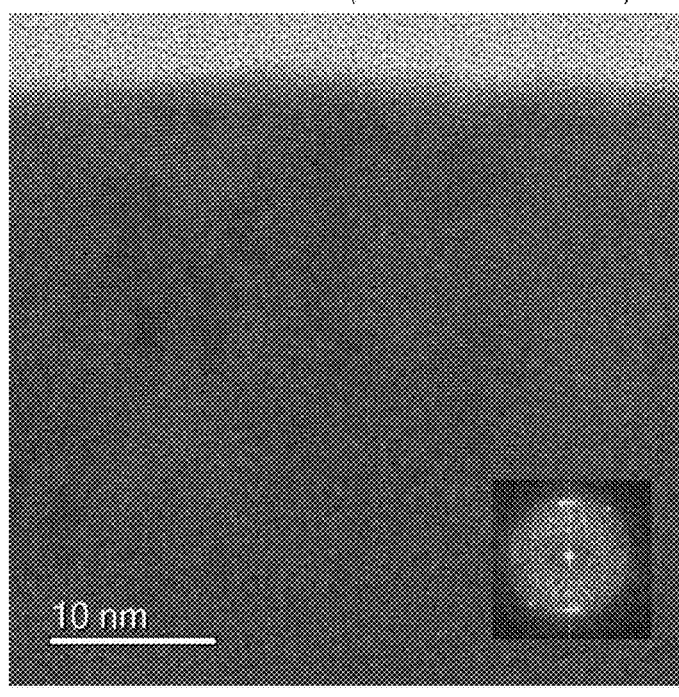
FIG. 9C provides a TEM image of the upper crystal layer and its Fourier-transformed image.
Figure 9D:
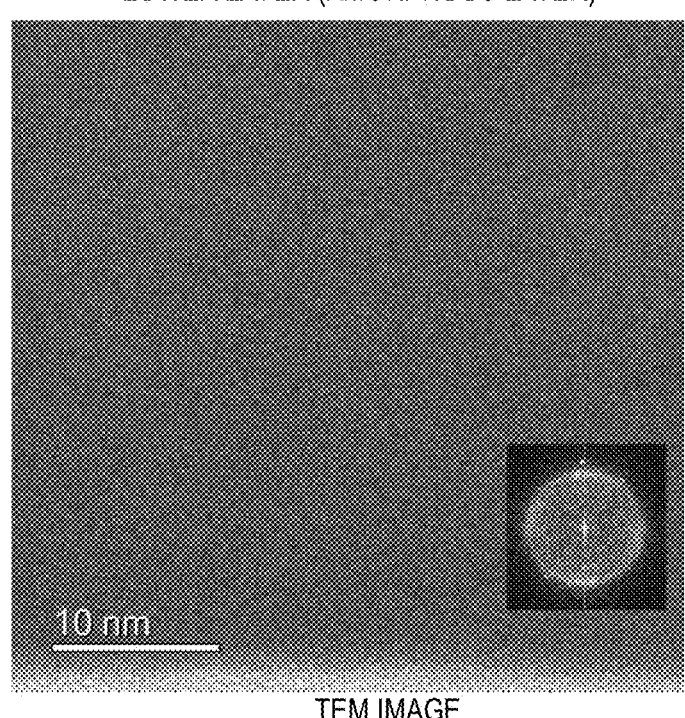
FIG. 9D provides a TEM image of the lower amorphous layer and its Fourier-transformed image.

FIGS. 9A and 9B provide measurement results by the electron diffraction method acquired from a sample manufactured by the method described with reference to FIGS. 7A to 7D. FIG. 9A provides an azimuthal distribution of diffraction spots on the plane (111) of the upper crystalline layer. FIG. 9B provides an azimuthal distribution of diffraction spots on the plane (111) of the lower amorphous layer. These profiles indicate the azimuthal dependence of diffraction spot intensities in Fourier-transformed images (which are equivalent to images of diffracted electron beams) acquired from TEM images as shown in FIGS. 9C and 9D. In comparison of these Fourier-transformed images, brighter diffraction spots are clearly observed in the upper crystalline layer. The horizontal axes of the two graphs represent azimuthal angle and the vertical axes represent the intensity of electron diffraction. FIGS. 9A and 9B provide measurement results on 40 nm×40 nm narrow cross-sectional areas in an oxide semiconductor layer having a 70-nm thickness.

The measurement result on the upper crystalline layer in FIG. 9A has high peaks. In contrast, the measurement result on the lower amorphous layer in FIG. 9B is flat without a high peak. These two measurement results indicate that the upper layer is a crystalline layer and the lower layer is an amorphous layer. The crystalline layer has peaks higher than twice of the average background level ($200\times10^6$). The highest intensity of the peaks in the amorphous layer is lower than twice of the average background level ($200\times10^6$). The average background level means the average value of the signals from the region that does not have a definitive peak.

Figure 10A:
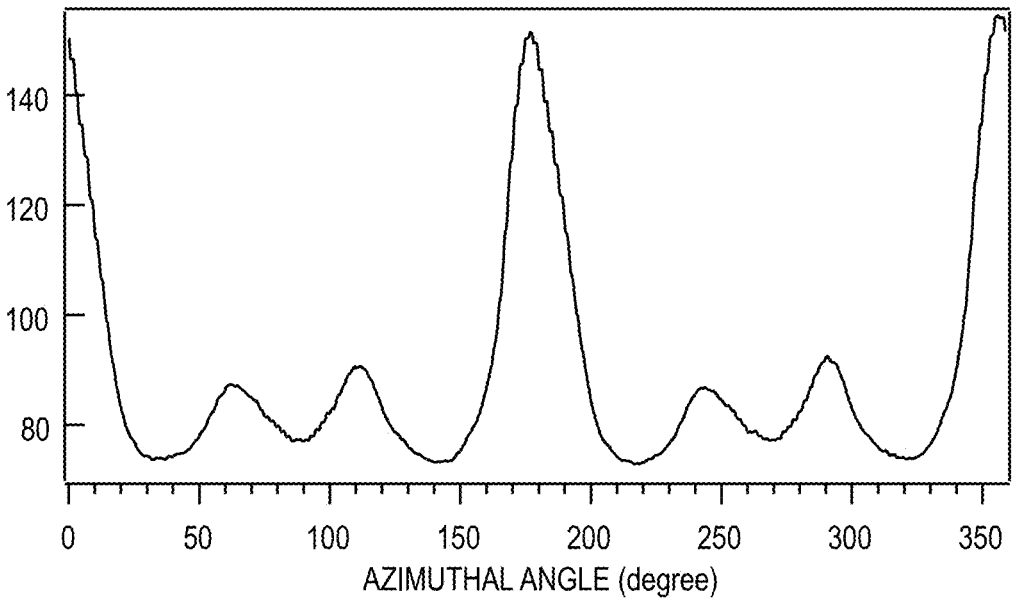
FIG. 10A illustrates an azimuthal distribution of diffraction spots on the plane (111) of a channel region.
Figure 10B:
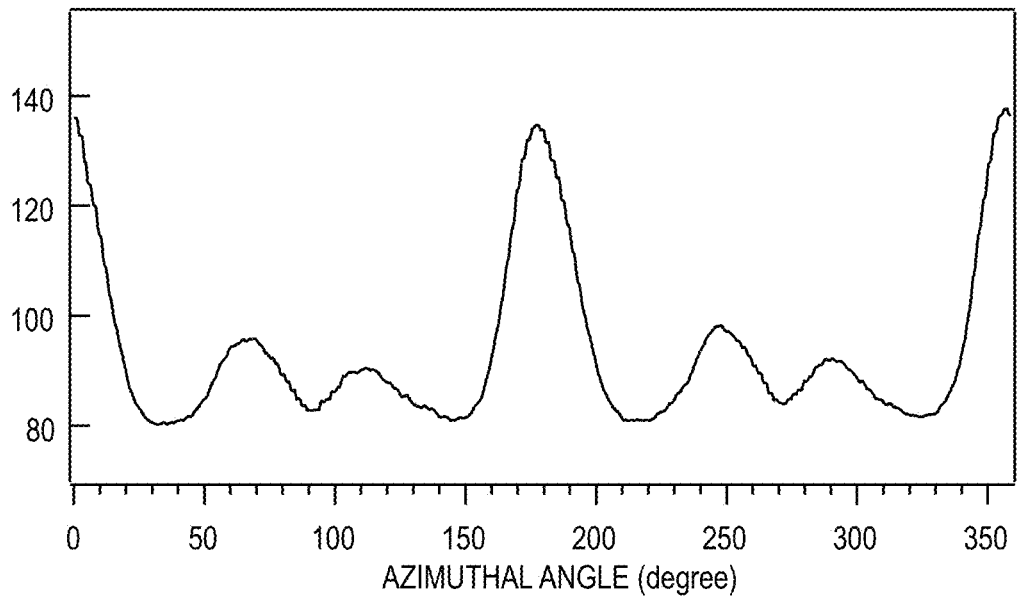
FIG. 10B illustrates an azimuthal distribution of diffraction spots on the plane (111) of a source/drain region.

FIGS. 10A and 10B provide measurement results by the electron diffraction method acquired from a sample manufactured by the method described with reference to FIGS. 7A to 7D. FIG. 10A provides an azimuthal distribution of diffraction spots on the plane (111) of the channel region. FIG. 10B provides an azimuthal distribution of diffraction spots on the plane (111) of a source/drain region. The horizontal axes of the two graphs represent azimuthal angle and the vertical axes represent the intensity of electron diffraction. FIGS. 10A and 10B provide measurement results on 70 nm×0.7 μm relatively large cross-sectional areas in an oxide semiconductor layer having a 70-nm thickness.

The degree of the (111) orientation calculated from the measurement result in FIG. 10A was 17.2. The degree of the (111) orientation calculated from the measurement result in FIG. 10B was 13.7. This lower degree of orientation in the source/drain region indicates that the source/drain regions are reduced in resistance appropriately. The degree of orientation of amorphous oxide semiconductor is 1. The degree of orientation is expressed by the magnitude of the peak intensity in the azimuthal distribution.

The degrees of orientation in narrow areas of the channel region and a source/drain region can be different values from the above-described ones. In other words, a narrow area of the channel region (highly-resistive region) may exhibit high degree of orientation and a narrow area of a source/drain region (low-resistive regions) may exhibit low degree of orientation. The Inventor's research revealed that the channel region exhibited a high degree of orientation and the source/drain regions exhibited a low degree of orientation appropriately when their cross-sectional areas have an area larger than the thickness of the oxide semiconductor film× 0.5 μm.

Device Structure

Figure 11:
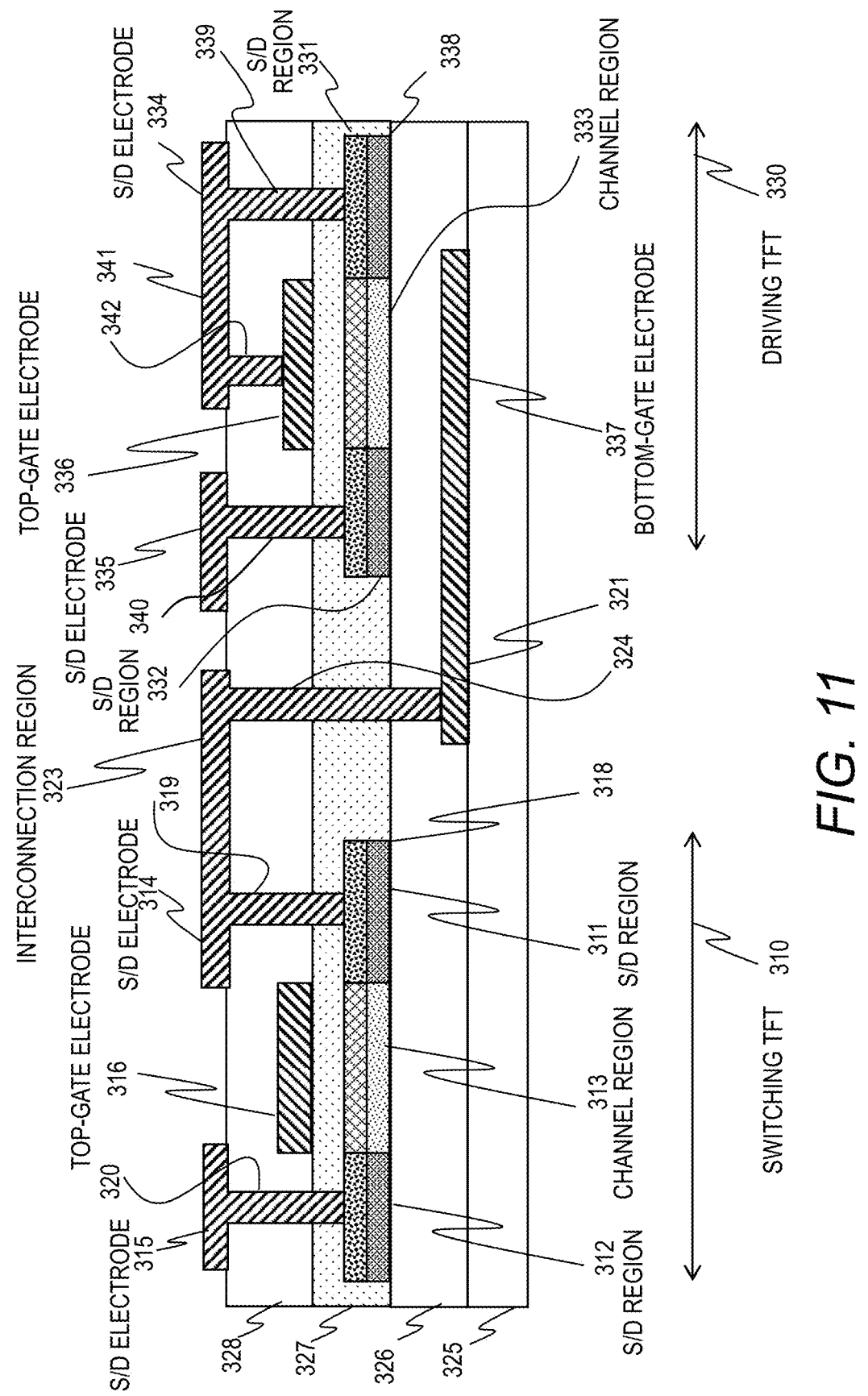
FIG. 11 illustrates a structural example of a pixel circuit including a switching oxide semiconductor TFT and a driving oxide semiconductor TFT having different S-values.

Some structural examples of a circuit including a plurality of oxide semiconductor TFTs are described. FIG. 11 illustrates a structural example of a pixel circuit including a switching oxide semiconductor TFT (hereinafter, also referred to simply as switching TFT) and a driving oxide semiconductor TFT (hereinafter, also referred to simply as driving TFT) having different S-values.

FIG. 11 schematically illustrates an example of the cross-sectional structure of a switching TFT and a driving TFT. A switching TFT 310 and a driving TFT 330 are fabricated on a flexible or rigid insulating substrate 325 made of resin or glass. The switching TFT 310 is a first oxide semiconductor TFT and the driving TFT 330 is a second oxide semiconductor TFT. The switching TFT 310 has a configuration such that the bottom gate electrode is excluded from the configuration described with reference to FIG. 3. The driving TFT 330 has the configuration described with reference to FIG. 3. The TFTs 310 and 330 can be fabricated together by the method described with reference to FIGS. 7A to 7D.

The driving TFT 330 includes a bottom-gate electrode 337 and an oxide semiconductor layer 338 upper than the bottom-gate electrode 337. A lower insulating layer 326 is provided between the bottom-gate electrode 337 and the oxide semiconductor layer 338. The oxide semiconductor layer 338 includes source/drain regions 331 and 332 and a channel region 333 located between the source/drain regions 331 and 332 in an in-plane direction.

The oxide semiconductor layer 338 is provided above and in direct contact with the lower insulating layer 326. The source/drain regions 331 and 332 are regions of an oxide semiconductor reduced in resistance. The channel region 333 is a region of the oxide semiconductor not reduced in resistance. As described with reference to FIG. 3, the source/drain regions 331 and 332 and the channel region 333 each consist of a lower amorphous layer and an upper crystalline layer.

A bottom-gate electrode 337 is opposed to the channel region 333 across the lower insulating layer 326. The lower insulating layer 326 is in direct contact with the channel region 333 and the bottom-gate electrode 337. The bottom-gate electrode 337 is supplied with a data signal and controls the driving current to an OLED element.

The driving TFT 330 further includes a top-gate electrode 336. An upper insulating layer 327 is provided between the top-gate electrode 336 and the oxide semiconductor layer 338. The oxide semiconductor layer 338, the upper insulating layer 327, and the top-gate electrode 336 are laid one above another in this order from the bottom (the side closer to the substrate); the upper insulating layer 327 is in direct contact with the oxide semiconductor layer 338 and the top-gate electrode 336.

An interlayer insulating layer 328 is provided to cover the top-gate electrode 336 and the upper insulating layer 327. Source/drain electrodes 334 and 335 extend through the interlayer insulating layer 328 and the upper insulating layer 327 and directly connect to the source/drain regions 331 and 332. The top regions of the source/drain electrodes 334 and 335 are in direct contact with the top face of the interlayer insulating layer 328. The electrode 334 to be provided with a lower potential between the source/drain electrodes 334 and 335 is connected to the anode electrode of the OLED element (not shown in FIG. 11).

The source/drain electrodes 334 and 335 respectively include contact regions 339 and 340 extending downward at locations outside the top-gate electrode 336 in a planar view. The contact region 339 extends through the interlayer insulating layer 328 and the upper insulating layer 327 and is in direct contact with the source/drain region 331. The contact region 340 extends through the interlayer insulating layer 328 and the upper insulating layer 327 and is in direct contact with the source/drain region 332.

The source/drain electrode 334 and the top-gate electrode 336 are connected by an interconnection region 341. Accordingly, these electrodes are maintained at the same potential. The interconnection region 341 is continued from the source/drain electrode 334 and they can be made of the same material at the same time. The interconnection region 341 is directly connected to the top-gate electrode 336. The interconnection region 341 includes a contact region 342 that extends through the interlayer insulating layer 328 and is in direct contact with the top face of the top-gate electrode 336. The source/drain electrode 334 can be supplied with a source potential. The top-gate electrode 336 is connected to the source/drain electrode 334 via the interconnector region 341 and its potential is equal to the potential of the source/drain electrode 334.

The switching TFT 310 is disposed at a location different from the location of the driving TFT 330 in a planar view. The switching TFT 310 includes an oxide semiconductor layer 318. The oxide semiconductor layer 318 is provided above and in direct contact with the lower insulating layer 326. The oxide semiconductor layer 318 includes source/drain regions 311 and 312 and a channel region 313 located between the source/drain regions 311 and 312 in an in-plane direction.

The source/drain regions 311 and 312 are regions of an oxide semiconductor reduced in resistance. The channel region 313 is a region of the oxide semiconductor not reduced in resistance. As described with reference to FIG. 3, the source/drain regions 311 and 312 and the channel region 313 each consist of a lower amorphous layer and an upper crystalline layer.

The switching TFT 310 further includes a top-gate electrode 316. The upper insulating layer 327 is located between the top-gate electrode 316 and the oxide semiconductor layer 318. The oxide semiconductor layer 318, the upper insulating layer 327, and the top-gate electrode 316 are laid one above another in this order from the bottom (the side closer to the substrate); the upper insulating layer 327 is in direct contact with the oxide semiconductor layer 318 and the top-gate electrode 316. The top-gate electrode 316 is supplied with a control signal for turning ON/OFF the switching TFT 310.

The interlayer insulating layer 328 covers the top-gate electrode 316 and the upper insulating layer 327. Source/drain electrodes 314 and 315 extend through the interlayer insulating layer 328 and the upper insulating layer 327 and directly connect to the source/drain regions 311 and 312. The top regions of the source/drain electrodes 314 and 315 are in direct contact with the top face of the interlayer insulating layer 328.

The source/drain electrodes 314 and 315 respectively include contact regions 319 and 320 extending downward at locations outside the top-gate electrode 316 in a planar view. The contact region 319 extends through the interlayer insulating layer 328 and the upper insulating layer 327 and is in direct contact with the source/drain region 311. The contact region 320 extends through the interlayer insulating layer 328 and the upper insulating layer 327 and is in direct contact with the source/drain region 312.

The source/drain electrode 314 of the switching TFT 310 and the bottom-gate electrode 337 of the driving TFT 330 are connected by an interconnection region 323. The interconnection region 323 is continued from the source/drain region 314 and they can be made of the same material at the same time. The interconnection region 323 is directly connected to the bottom-gate electrode 337.

The interconnection region 323 includes a contact region 324 that extends through the interlayer insulating layer 328, the upper insulating layer 327, and the lower insulating layer 326 and is in direct contact with the top face of the region 321 extending from the bottom-gate electrode 337. The bottom-gate electrode 337 is connected to the source/drain electrode 314 via the interconnector region 323 and its potential is equal to the potential of the source/drain electrode 314.

Figure 12:
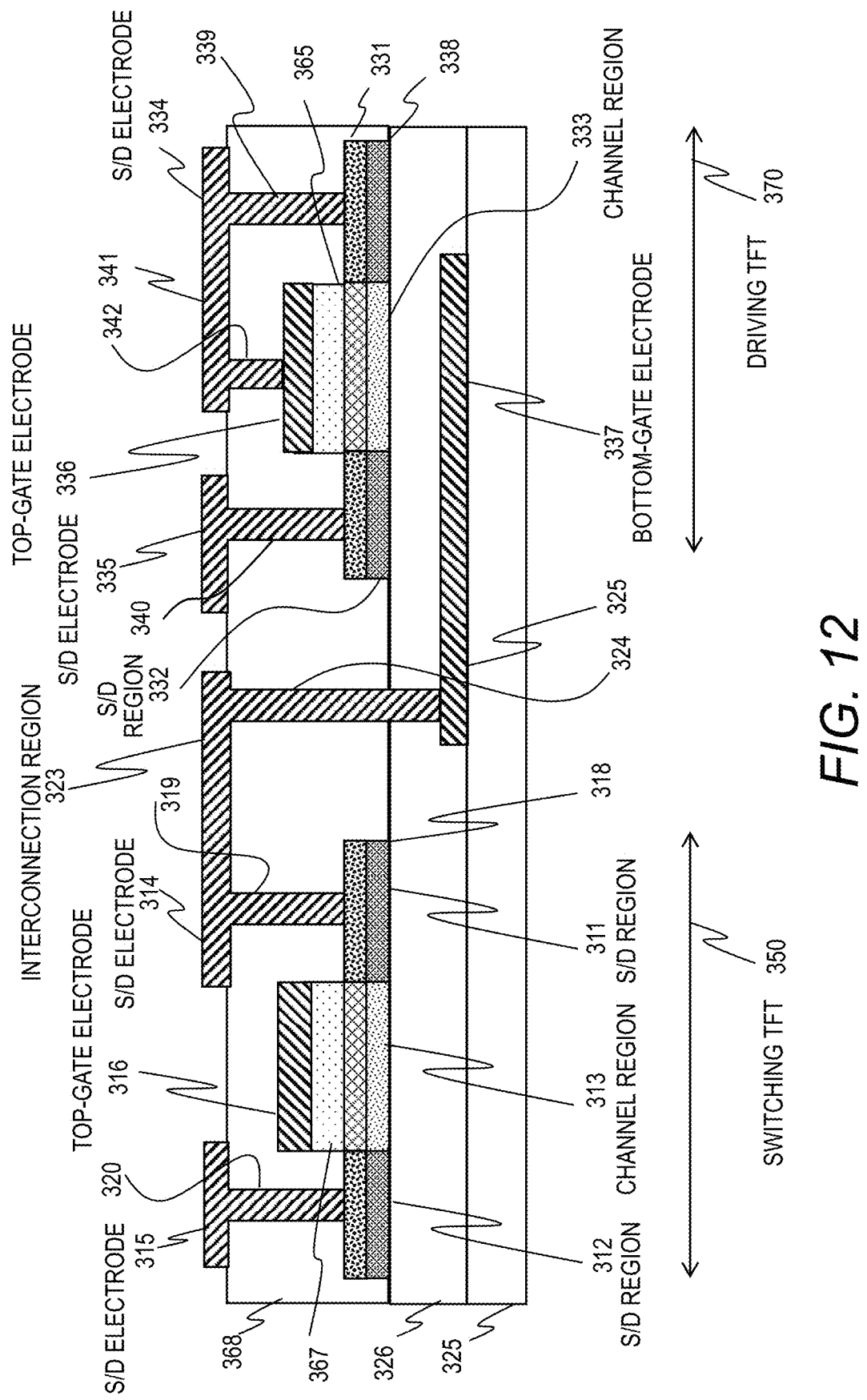
FIG. 12 illustrates another structural example of a pixel circuit including a switching oxide semiconductor TFT and a driving oxide semiconductor TFT having different S-values.

FIG. 12 illustrates a structural example of a pixel circuit including a switching TFT and a driving TFT having different S-values. Differences from the configuration example in FIG. 11 are mainly described. FIG. 12 schematically illustrates an example of the cross-sectional structure of a switching TFT and a driving TFT. A switching TFT 350 and a driving TFT 370 are fabricated on a flexible or rigid insulating substrate 325 made of resin or glass. The switching TFT 350 has a configuration such that the bottom gate electrode is excluded from the configuration described with reference to FIG. 5. The driving TFT 370 has the configuration described with reference to FIG. 5. The TFTs 350 and 370 can be fabricated together by the method described with reference to FIGS. 8A to 8D.

Compared to the configuration example in FIG. 11, the example in FIG. 12 includes a top-gate insulator 365 of the driving TFT 370 and a top-gate insulator 367 of the switching TFT 350, in place of the upper insulating layer 327. The top-gate insulators 365 and 367 can be produced together by etching an insulating layer. The top-gate insulator 365 is located between the top-gate electrode 336 and the channel region 333 and does not overlap the source/drain regions 331 and 332 in a planar view. The top-gate insulator 367 is located between the top-gate electrode 316 and the channel region 313 and does not overlap the source/drain regions 311 and 312 in a planar view.

In place of the interlayer insulating layer 328, an interlayer insulating layer 368 is provided. The interlayer insulating layer 368 is in direct contact with and covers the source/drain regions 311, 312, 331, and 332. In the switching TFT 350, a contact region 319 of the source/drain electrode 314 extends through the interlayer insulating layer 368 and is in contact with (directly connected to) the source/drain region 311 in a hole of the interlayer insulating layer 368. A contact region 320 of the source/drain electrode 315 extends through the interlayer insulating layer 368 and is in contact with (directly connected to) the source/drain region 312 in a hole of the interlayer insulating layer 368.

In the driving TFT 370, a contact region 339 of the source/drain electrode 334 extends through the interlayer insulating layer 368 and is in contact with (directly connected to) the source/drain region 331 in a hole of the interlayer insulating layer 368. A contact region 340 of the source/drain electrode 335 extends through the interlayer insulating layer 368 and is in contact with (directly connected to) the source/drain region 332 in a hole of the interlayer insulating layer 368.

Figure 13:
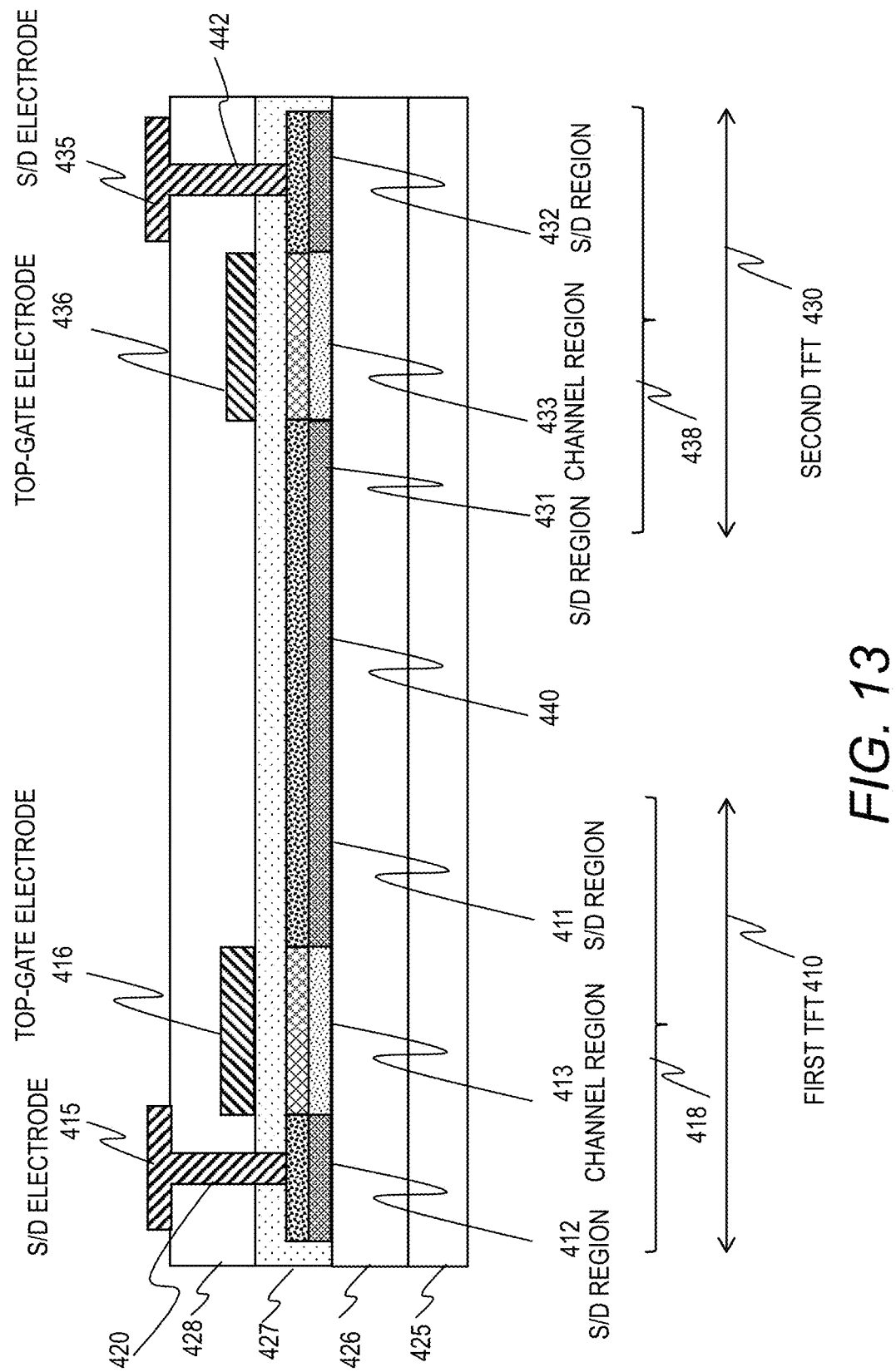
FIG. 13 illustrates a structural example of a circuit including two TFTs.

FIG. 13 illustrates a structural example of a circuit including two TFTs. The first TFT and the second TFT have the same structure as the switching TFT 310 in FIG. 11. The configuration example in FIG. 13 uses an oxide reduced in resistance as a line. Specifically, a source/drain region of the first TFT 410 and a source/drain region of the second TFT 430 are connected by a line (line region) 440 of an oxide semiconductor reduced in resistance. This configuration eliminates contact resistance between a source/drain region and a metal electrode. The TFTs 410 and 430 correspond to a first oxide semiconductor TFT and a third oxide semiconductor TFT, respectively; they can be fabricated together by the method described with reference to FIGS. 7A to 7D.

The first TFT 410 and the second TFT 430 are located above a lower insulating layer 426 provided on a substrate 425. The first TFT 410 is disposed at a location different from the location of the second TFT 430 in a planar view.

The first TFT 410 includes an oxide semiconductor layer 418. The oxide semiconductor layer 418 includes source/drain regions 411 and 412 and a channel region 413 located between the source/drain regions 411 and 412 in an in-plane direction.

The source/drain regions 411 and 412 are regions of an oxide semiconductor reduced in resistance. The channel region 413 is a region of the oxide semiconductor not reduced in resistance. The source/drain regions 411 and 412 and the channel region 413 each consist of a lower amorphous layer and an upper crystalline layer.

The first TFT 410 includes a top-gate electrode 416. An upper insulating layer 427 is provided between the top-gate electrode 416 and the oxide semiconductor layer 418. The oxide semiconductor layer 418, the upper insulating layer 427, and the top-gate electrode 416 are laid one above another in this order from the bottom (the side closer to the substrate); the upper insulating layer 427 is in direct contact with the oxide semiconductor layer 418 and the top-gate electrode 416. The top-gate electrode 416 is supplied with a control signal for turning ON/OFF the first TFT 410, for example.

An interlayer insulating layer 428 is provided to cover the top-gate electrode 416 and the upper insulating layer 427. A source/drain electrode 415 extends through the interlayer insulating layer 428 and the upper insulating layer 427 and directly connects to the source/drain region 412. The top region of the source/drain electrode 415 is in direct contact with the top face of the interlayer insulating layer 428.

The source/drain electrode 415 includes a contact region 420 extending downward at a location outside the top-gate electrode 416 in a planar view. The contact region 420 extends through the interlayer insulating layer 428 and the upper insulating layer 427 and is in direct contact with the source/drain region 412.

The second TFT 430 includes an oxide semiconductor layer 438. The oxide semiconductor layer 438 includes source/drain regions 431 and 432 and a channel region 433 located between the source/drain regions 431 and 432 in an in-plane direction.

The source/drain regions 431 and 432 are regions of an oxide semiconductor reduced in resistance. The channel region 433 is a region of the oxide semiconductor not reduced in resistance. The source/drain regions 431 and 432 and the channel region 433 each consist of a lower amorphous layer and an upper crystalline layer.

The second TFT 430 includes a top-gate electrode 436. The upper insulating layer 427 is located between the top-gate electrode 436 and the oxide semiconductor layer 438. The oxide semiconductor layer 438, the upper insulating layer 427, and the top-gate electrode 436 are laid one above another in this order from the bottom (the side closer to the substrate); the upper insulating layer 427 is in direct contact with the oxide semiconductor layer 438 and the top-gate electrode 436. The top-gate electrode 436 is supplied with a control signal for turning ON/OFF the second TFT 430, for example.

The interlayer insulating layer 428 covers the top-gate electrode 436 and the upper insulating layer 427. A source/drain electrode 435 extends through the interlayer insulating layer 428 and the upper insulating layer 427 and directly connects to the source/drain region 432. The top region of the source/drain electrodes 435 is in direct contact with the top face of the interlayer insulating layer 428.

The source/drain electrode 435 includes a contact region 442 extending downward at a location outside the top-gate electrode 436. The contact region 442 extends through the interlayer insulating layer 428 and the upper insulating layer 427 and is in direct contact with the source/drain region 432.

The oxide semiconductor layer 418 of the first TFT 410 and the oxide semiconductor layer 438 of the second TFT 430 are parts of an unseparated semiconductor film and a line (line region) 440 is located therebetween. The line 440 is made of an oxide semiconductor reduced in resistance. The source/drain region 411 of the oxide semiconductor layer 418, the line 440, and the source/drain region 431 of the oxide semiconductor layer 438 are unseparated and these are made of the same material at the same time.

For example, a manufacturing step implants impurity ions to an oxide semiconductor through the insulating layer 427 using the top-gate electrodes 416 and 436 as masks to produce the source/drain region 411, the line 440, and the source/drain region 431 together. As described above, the first TFT 410 and the second TFT 430 are connected in series by the line 440 made of the oxide semiconductor reduced in resistance. This configuration attains a low contact resistance between an oxide semiconductor and a metal in the TFT.

Figure 14:
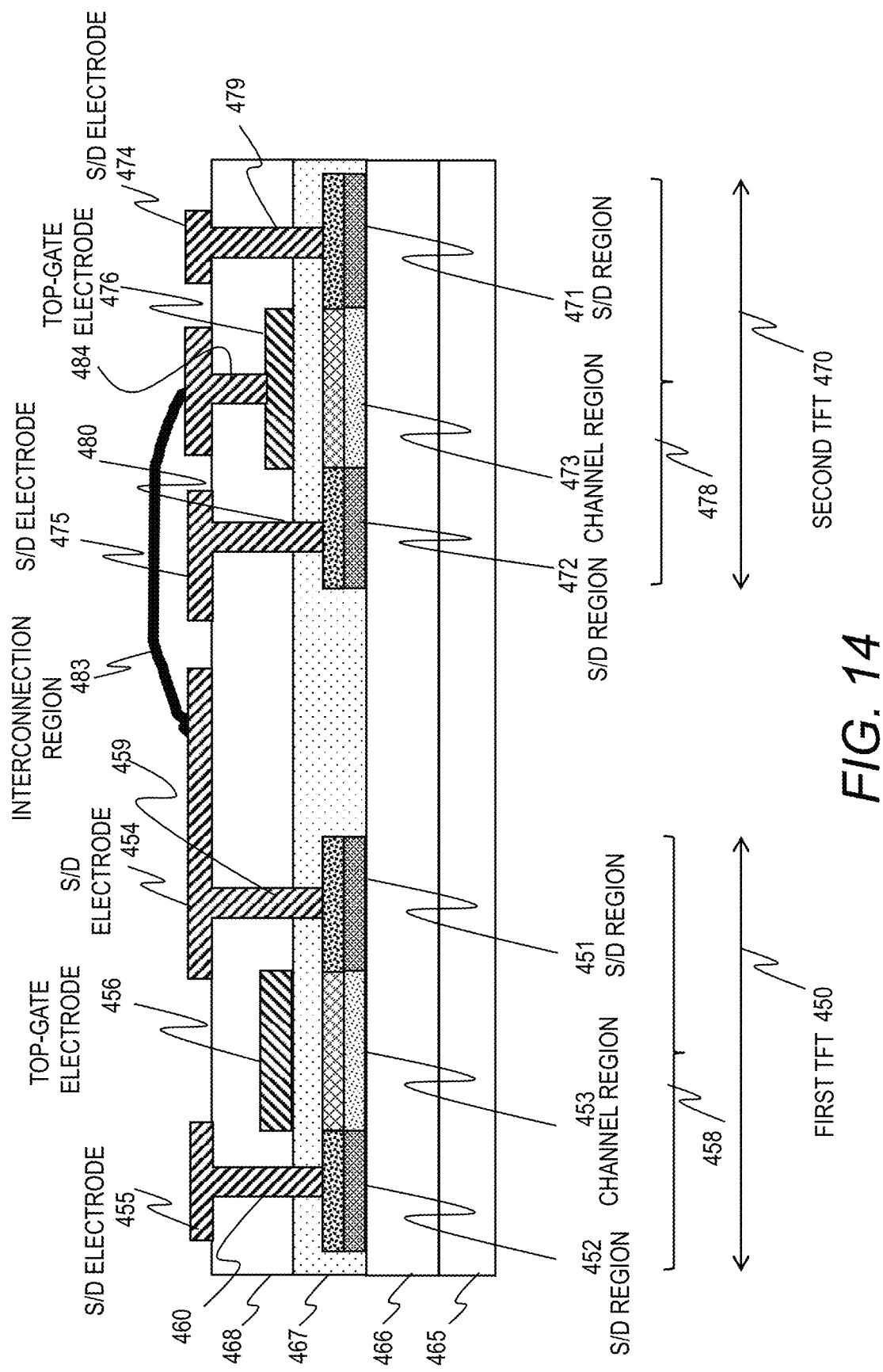
FIG. 14 illustrates another structural example of a circuit including two TFTs.

FIG. 14 illustrates a structural example of a circuit including two TFTs. The first TFT 450 and the second TFT 470 have the same structure as the switching TFT 310 in FIG. 11. The first TFT 450 and the second TFT 470 correspond to a first oxide semiconductor TFT and a fourth oxide semiconductor TFT, respectively. The configuration example in FIG. 14 connects the source output of one TFT to the top-gate electrode of the other TFT. The gate of the crystalline channel of the latter TFT is driven by the source output of the former TFT to expedite the operation. This configuration is applicable to connection in the drivers 31 and 32 and connection of the output of the driver 31 or 32 to the gate of a TFT in a pixel circuit.

The first TFT 450 and the second TFT 470 are fabricated on an insulating substrate 465. The TFTs 450 and 470 have a configuration such that the bottom-gate electrode is excluded from the configuration described with reference to FIG. 3. The TFTs 450 and 470 can be fabricated together by the method described with reference to FIGS. 7A to 7D.

The first TFT 450 and the second TFT 470 are located above a lower insulating layer 466 provided on a substrate 465. The first TFT 450 is disposed at a location different from the location of the second TFT 470 in a planar view.

The first TFT 450 includes an oxide semiconductor layer 458. The oxide semiconductor layer 458 is provided above and in direct contact with the lower insulating layer 466. The oxide semiconductor layer 458 includes source/drain regions 451 and 452 and a channel region 453 located between the source/drain regions 451 and 452 in an in-plane direction.

The source/drain regions 451 and 452 are regions of an oxide semiconductor reduced in resistance. The channel region 453 is a region of the oxide semiconductor not reduced in resistance. As described with reference to FIG. 3, the source/drain regions 451 and 452 and the channel region 453 each consist of a lower amorphous layer and an upper crystalline layer.

The first TFT 450 further includes a top-gate electrode 456. An upper insulating layer 467 is located between the top-gate electrode 456 and the oxide semiconductor layer 458. The oxide semiconductor layer 458, the upper insulating layer 467, and the top-gate electrode 456 are laid one above another in this order from the bottom (the side closer to the substrate); the upper insulating layer 467 is in direct contact with the oxide semiconductor layer 458 and the top-gate electrode 456. The top-gate electrode 456 is supplied with a control signal for turning ON/OFF the first TFT 450, for example.

An interlayer insulating layer 468 is provided to cover the top-gate electrode 456 and the upper insulating layer 467. Source/drain electrodes 454 and 455 extend through the interlayer insulating layer 468 and the upper insulating layer 467 and directly connect to the source/drain regions 451 and 452, respectively. The top regions of the source/drain electrodes 454 and 455 are in direct contact with the top face of the interlayer insulating layer 468.

The source/drain electrodes 454 and 455 respectively include contact regions 459 and 460 extending downward at locations outside the top-gate electrode 456 in a planar view. The contact region 459 extends through the interlayer insulating layer 468 and the upper insulating layer 467 and is in direct contact with the source/drain region 451. The contact region 460 extends through the interlayer insulating layer 468 and the upper insulating layer 467 and is in direct contact with the source/drain region 452.

The second TFT 470 includes an oxide semiconductor layer 478. The oxide semiconductor layer 478 is provided above and in direct contact with the lower insulating layer 466. The oxide semiconductor layer 478 includes source/drain regions 471 and 472 and a channel region 473 located between the source/drain regions 471 and 472 in an in-plane direction.

The source/drain regions 471 and 472 are regions of an oxide semiconductor reduced in resistance. The channel region 473 is a region of the oxide semiconductor not reduced in resistance. As described with reference to FIG. 3, the source/drain regions 471 and 472 and the channel region 473 each consist of a lower amorphous layer and an upper crystalline layer.

The second TFT 470 further includes a top-gate electrode 476. The upper insulating layer 467 is located between the top-gate electrode 476 and the oxide semiconductor layer 478. The oxide semiconductor layer 478, the upper insulating layer 467, and the top-gate electrode 476 are laid one above another in this order from the bottom (the side closer to the substrate); the upper insulating layer 467 is in direct contact with the oxide semiconductor layer 478 and the top-gate electrode 476. The top-gate electrode 476 is supplied with a control signal for turning ON/OFF the second TFT 470, for example.

The interlayer insulating layer 468 covers the top-gate electrode 476 and the upper insulating layer 467. Source/drain electrodes 474 and 475 extend through the interlayer insulating layer 468 and the upper insulating layer 467 and directly connect to the source/drain regions 471 and 472, respectively. The top regions of the source/drain electrodes 474 and 475 are in direct contact with the top face of the interlayer insulating layer 468.

The source/drain electrodes 474 and 475 respectively include contact regions 479 and 480 extending downward at locations outside the top-gate electrode 456 in a planar view. The contact region 479 extends through the interlayer insulating layer 468 and the upper insulating layer 467 and is in direct contact with the source/drain region 471. The contact region 480 extends through the interlayer insulating layer 468 and the upper insulating layer 467 and is in direct contact with the source/drain region 472.

The source/drain electrode 454 of the first TFT 450 and the top-gate electrode 476 of the second TFT 470 are connected by an interconnection region 483. The interconnection region 483 is continued from the source/drain electrode 454 and they can be made of the same material at the same time. The interconnection region 483 is directly connected to the top-gate electrode 476.

The interconnection region 483 includes a contact region 484 that extends through the interlayer insulating layer 468 and is in direct contact with the top face of the top-gate electrode 476. The top-gate electrode 476 is connected to the source/drain electrode 454 via the interconnector region 483 and its potential is equal to the potential of the source/drain electrode 454.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. An oxide semiconductor thin-film transistor device comprising:
   a substrate; and
   one or more oxide semiconductor thin-film transistors disposed upper than the substrate,
   wherein the one or more oxide semiconductor thin-film transistors include a first oxide semiconductor thin-film transistor,
   wherein the first oxide semiconductor thin-film transistor includes:
   a first oxide semiconductor layer;

21                                          22 a first top-gate electrode disposed upper than the first oxide semiconductor layer; and a first source/drain electrode, wherein the first oxide semiconductor layer includes:

a first channel region overlapping the first top-gate electrode in a planar view; and two first low-resistive regions sandwiching the first channel region, wherein the first source/drain electrode is located upper than the first top-gate electrode and extends through an insulating region overlapping one of the two first low-resistive regions in a planar view to be in contact with the one of the two first low-resistive regions, wherein each of the two first low-resistive regions and the first channel region includes a lower amorphous layer and an upper crystalline layer having a composition identical to a composition of the amorphous layer, wherein the one or more oxide semiconductor thin-film transistors further include a second oxide semiconductor thin-film transistor, wherein the second oxide semiconductor thin-film transistor includes:

a second oxide semiconductor layer;

a second top-gate electrode disposed upper than the second oxide semiconductor layer;

a bottom-gate electrode disposed lower than the second oxide semiconductor layer; and two second source/drain electrodes, wherein the second oxide semiconductor layer includes:

a second channel region overlapping the second top-gate electrode and the bottom-gate electrode in a planar view; and two second low-resistive regions sandwiching the second channel region, wherein the two second source/drain electrodes are located upper than the second top-gate electrode and extend through an insulating region overlapping the two second low-resistive regions in a planar view to be in contact with the two second low-resistive regions, respectively, wherein each of the two second low-resistive regions and the second channel region includes a lower amorphous layer and an upper crystalline layer having a composition identical to a composition of the amorphous layer, wherein the first oxide semiconductor thin-film transistor is configured to be turned ON/OFF in accordance with a control signal supplied to the first top-gate electrode, and wherein the second oxide semiconductor thin-film transistor is configured to control an amount of electric current to flow through the second channel region in accordance with a control signal supplied to the bottom-gate electrode.

2. The oxide semiconductor thin-film transistor device according to claim 1, wherein the crystalline layer exhibits an intensity peak in an azimuthal distribution of electron diffraction intensities, and wherein the amorphous layer does not exhibit an intensity peak in an azimuthal distribution of electron diffraction intensities.

3. The oxide semiconductor thin-film transistor device according to claim 1, wherein the crystalline layers of the two second low-resistive regions have a lower degree of orientation than the crystalline layer of the second channel region.

4. The oxide semiconductor thin-film transistor device according to claim 1, wherein the second top-gate electrode of the second oxide semiconductor thin-film transistor is configured to be supplied with a constant potential or in a floating state.

5. The oxide semiconductor thin-film transistor device according to claim 1, wherein the crystalline layers of the two first low-resistive regions have a lower degree of orientation than the crystalline layer of the first channel region.

6. The oxide semiconductor thin-film transistor device according to claim 5, wherein the degree of orientation of the crystalline layer is expressed by a magnitude of an intensity peak in an azimuthal distribution of electron diffraction intensities.

7. The oxide semiconductor thin-film transistor device according to claim 1, wherein the first source/drain electrode is connected to the bottom-gate electrode of the second oxide semiconductor thin-film transistor.

8. The oxide semiconductor thin-film transistor device according to claim 7, wherein the second top-gate electrode is connected to an electrode to be provided with a lower potential between the two second source/drain electrodes.

9. An oxide semiconductor thin-film transistor device comprising:

a substrate; and one or more oxide semiconductor thin-film transistors disposed upper than the substrate, wherein the one or more oxide semiconductor thin-film transistors include a first oxide semiconductor thin-film transistor, wherein the first oxide semiconductor thin-film transistor includes:

a first oxide semiconductor layer;

a first top-gate electrode disposed upper than the first oxide semiconductor layer; and a first source/drain electrode, wherein the first oxide semiconductor layer includes:

a first channel region overlapping the first top-gate electrode in a planar view; and two first low-resistive regions sandwiching the first channel region, wherein the first source/drain electrode is located upper than the first top-gate electrode and extends through an insulating region overlapping one of the two first low-resistive regions in a planar view to be in contact with the one of the two first low-resistive regions, wherein each of the two first low-resistive regions and the first channel region includes a lower amorphous layer and an upper crystalline layer having a composition identical to a composition of the amorphous layer, wherein the one or more oxide semiconductor thin-film transistors further include a third oxide semiconductor thin-film transistor, wherein the third oxide semiconductor thin-film transistor includes:

a third oxide semiconductor layer;

a third top-gate electrode disposed upper than the third oxide semiconductor layer; and a third source/drain electrode, wherein the third oxide semiconductor layer includes:

a third channel region overlapping the third top-gate electrode in a planar view; and two third low-resistive regions sandwiching the third channel region, wherein the third source/drain electrode is located upper than the third top-gate electrode and extends through an insulating region overlapping one of the two third low-resistive regions in a planar view to be in contact with the one of the two third low-resistive regions, wherein each of the third low-resistive regions and the third channel region includes a lower amorphous layer and an upper crystalline layer having a composition identical to a composition of the amorphous layer, wherein the first oxide semiconductor layer and the third oxide semiconductor layer are disposed on the same insulating layer, and wherein a low-resistive oxide semiconductor layer extending from the other one of the two first low-resistive regions is continued to the other one of the two third low-resistive regions.

10. An oxide semiconductor thin-film transistor device comprising:

a substrate; and one or more oxide semiconductor thin-film transistors disposed upper than the substrate, wherein the one or more oxide semiconductor thin-film transistors include a first oxide semiconductor thin-film transistor, wherein the first oxide semiconductor thin-film transistor includes:

a first oxide semiconductor layer;

a first top-gate electrode disposed upper than the first oxide semiconductor layer; and a first source/drain electrode, wherein the first oxide semiconductor layer includes:

a first channel region overlapping the first top-gate electrode in a planar view; and two first low-resistive regions sandwiching the first channel region, wherein the first source/drain electrode is located upper than the first top-gate electrode and extends through an insulating region overlapping one of the two first low-resistive regions in a planar view to be in contact with the one of the two first low-resistive regions, wherein each of the two first low-resistive regions and the first channel region includes a lower amorphous layer and an upper crystalline layer having a composition identical to a composition of the amorphous layer, wherein the one or more oxide semiconductor thin-film transistors further include a fourth oxide semiconductor thin-film transistor, wherein the fourth oxide semiconductor thin-film transistor includes:

a fourth oxide semiconductor layer;

a fourth top-gate electrode disposed upper than the fourth oxide semiconductor layer; and a fourth source/drain electrode, wherein the fourth oxide semiconductor layer includes:

a fourth channel region overlapping the fourth top-gate electrode in a planar view; and two fourth low-resistive regions sandwiching the fourth channel region, wherein the fourth source/drain electrode is located upper than the fourth top-gate electrode and extends through an insulating region overlapping one of the two fourth low-resistive regions in a planar view to be in contact with the one of the two fourth low-resistive regions, wherein each of the two fourth low-resistive regions and the fourth channel region includes a lower amorphous layer and an upper crystalline layer having a composition identical to a composition of the amorphous layer, and wherein the first source/drain electrodes is connected to the fourth top-gate electrode for the fourth top-gate electrode to be at a potential equal to a potential of the first source/drain electrode.

11. A method of manufacturing an oxide semiconductor thin-film transistor device, the method comprising:

producing an oxide semiconductor layer;

producing a gate insulating layer above the oxide semiconductor layer;

producing a top-gate electrode above the gate insulating layer;

removing the gate insulating layer in regions outside the top-gate electrode by etching to partially expose the oxide semiconductor layer after producing the top-gate electrode; and producing low-resistive regions in the oxide semiconductor layer by a resistance-reducing process includes processing the exposed part of the oxide semiconductor layer with plasma using the top-gate electrode as a mask, wherein the producing an oxide semiconductor layer includes:

producing a lower amorphous layer; and producing an upper crystalline layer after producing the lower amorphous layer.

*    *    *    *    *